(12) United States Patent
Li et al.

(10) Patent No.: US 11,974,472 B2
(45) Date of Patent: *Apr. 30, 2024

(54) DISPLAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Yunlong Li, Beijing (CN); Pengcheng Lu, Beijing (CN); Kui Zhang, Beijing (CN); Li Liu, Beijing (CN); Kuanta Huang, Beijing (CN); Shengji Yang, Beijing (CN); Xiaochuan Chen, Beijing (CN); Dacheng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 914 days.

This patent is subject to a terminal disclaimer.

(21) Appl. No.: 16/958,921

(22) PCT Filed: Aug. 27, 2019

(86) PCT No.: PCT/CN2019/102888
§ 371 (c)(1),
(2) Date: Jun. 29, 2020

(87) PCT Pub. No.: WO2021/035548
PCT Pub. Date: Mar. 4, 2021

(65) Prior Publication Data
US 2022/0384554 A1    Dec. 1, 2022

(51) Int. Cl.
*H10K 59/131*    (2023.01)
*H10K 50/844*    (2023.01)
(Continued)

(52) U.S. Cl.
CPC ......... *H10K 59/131* (2023.02); *H10K 50/844* (2023.02); *H10K 71/00* (2023.02); *H10K 59/1201* (2023.02); *H10K 59/88* (2023.02)

(58) Field of Classification Search
CPC .. H10K 59/131; H10K 59/1201; H10K 59/88; H10K 71/00; H10K 50/844
See application file for complete search history.

(56) References Cited

U.S. PATENT DOCUMENTS

| 10,170,534 B1 | 1/2019 | Kim et al. |
| 10,367,046 B2 | 7/2019 | Lee et al. |

(Continued)

FOREIGN PATENT DOCUMENTS

| CN | 106935628 | 7/2017 |
| CN | 106981584 | 7/2017 |

(Continued)

OTHER PUBLICATIONS

European search report issued by the European Patent Office for the corresponding European Patent Application No. 19933216.4, dated Aug. 23, 2022.

(Continued)

*Primary Examiner* — Nathan W Ha
(74) *Attorney, Agent, or Firm* — Leason Ellis LLP

(57) ABSTRACT

A display substrate and a manufacturing method and a display device are provided. The display substrate includes: a base substrate, a first insulation layer, a first electrode pattern, a connecting electrode pattern, a second electrode, a light-emitting functional layer, and a first filling layer. The second electrode is connected with the connecting electrode pattern, the second electrode and the first electrode pattern are spaced apart from each other. The light-emitting functional layer is located between the first electrode pattern and the second electrode. The first filling layer is located (Continued)

between the connecting electrode pattern and the first electrode pattern. The first filling layer and the light-emitting functional layer are different layers; a portion of the first insulation layer that is located between the first electrode pattern and the connecting electrode pattern has a groove, and the first filling layer is at least partially located in the groove.

20 Claims, 15 Drawing Sheets

(51) Int. Cl.
*H10K 71/00* (2023.01)
*H10K 59/12* (2023.01)
*H10K 59/88* (2023.01)

(56) References Cited

U.S. PATENT DOCUMENTS

| | | | |
|---|---|---|---|
| 10,475,868 B2 | 11/2019 | Park et al. | |
| 11,430,853 B2 | 8/2022 | Lu et al. | |
| 2006/0061524 A1 | 3/2006 | Suh | |
| 2008/0297042 A1 | 12/2008 | Ahn et al. | |
| 2009/0009068 A1* | 1/2009 | Fujimura | H10K 50/824 445/24 |
| 2010/0149473 A1 | 6/2010 | Guo et al. | |
| 2010/0289729 A1 | 11/2010 | Nakamura | |
| 2011/0227896 A1* | 9/2011 | Hwang | H10K 59/124 345/82 |
| 2013/0056736 A1 | 3/2013 | Kim et al. | |
| 2013/0270548 A1* | 10/2013 | Hara | H10K 59/131 257/43 |
| 2014/0225843 A1 | 8/2014 | Kuo | |
| 2015/0001501 A1* | 1/2015 | Cho | H10K 59/12 257/40 |
| 2015/0034921 A1 | 2/2015 | Kim | |
| 2015/0060823 A1 | 3/2015 | Furuie | |
| 2015/0357396 A1* | 12/2015 | Han | H10K 59/00 257/40 |
| 2016/0211480 A1* | 7/2016 | Hanari | H10K 59/131 |
| 2016/0268356 A1* | 9/2016 | Go | H10K 59/123 |
| 2017/0244069 A1* | 8/2017 | Kim | H10K 50/856 |
| 2018/0033830 A1 | 2/2018 | Kim et al. | |
| 2018/0151838 A1* | 5/2018 | Park | G06F 3/0412 |
| 2018/0166525 A1 | 6/2018 | Kim et al. | |
| 2018/0190742 A1* | 7/2018 | He | H10K 50/81 |
| 2018/0197924 A1* | 7/2018 | Tada | H10K 71/00 |
| 2018/0287093 A1* | 10/2018 | Lee | H10K 59/131 |
| 2018/0348934 A1 | 12/2018 | Matsumoto | |
| 2018/0366531 A1* | 12/2018 | Kato | H01L 27/124 |
| 2019/0067410 A1* | 2/2019 | Kwon | H10K 77/111 |
| 2019/0081124 A1* | 3/2019 | Ye | H01L 24/05 |
| 2019/0097162 A1 | 3/2019 | Wang | |
| 2019/0157607 A1* | 5/2019 | Kim | H10K 77/111 |
| 2019/0164995 A1 | 5/2019 | Lee et al. | |
| 2019/0214596 A1* | 7/2019 | Park | G06F 3/0446 |
| 2019/0229175 A1 | 7/2019 | Lhee et al. | |
| 2019/0237533 A1 | 8/2019 | Kim et al. | |
| 2019/0250746 A1 | 8/2019 | Han et al. | |
| 2019/0288046 A1 | 9/2019 | Park et al. | |
| 2019/0334112 A1 | 10/2019 | Lee et al. | |
| 2019/0363290 A1* | 11/2019 | Watanabe | H05B 33/10 |
| 2019/0364671 A1* | 11/2019 | Mihotani | H05K 3/323 |
| 2019/0386074 A1 | 12/2019 | Li et al. | |
| 2020/0035773 A1* | 1/2020 | Cheng | H01L 27/124 |
| 2020/0280021 A1* | 9/2020 | Li | H10K 50/844 |
| 2021/0408202 A1* | 12/2021 | Liu | H10K 59/1216 |
| 2022/0181429 A1 | 6/2022 | Morita | |
| 2022/0384553 A1* | 12/2022 | Li | H01L 27/124 |

FOREIGN PATENT DOCUMENTS

| | | |
|---|---|---|
| CN | 107452780 | 12/2017 |
| CN | 107665062 | 2/2018 |
| CN | 107742635 | 2/2018 |
| CN | 108122944 | 6/2018 |
| CN | 109509771 | 3/2019 |
| CN | 109755280 A | 5/2019 |
| CN | 109801956 | 5/2019 |
| CN | 109860204 | 6/2019 |
| CN | 109904197 | 6/2019 |
| CN | 110162206 | 8/2019 |
| IN | 110098223 | 8/2019 |
| KR | 20140075320 A | 6/2014 |

OTHER PUBLICATIONS

European search report issued by the European Patent Office for the corresponding European Patent Application No. 19933241.2, dated Aug. 23, 2022.
Ex Parte Quayle Action for related U.S. Appl. No. 16/959,214, dated Jan. 12, 2022. 12 pages.
Non-Final Office Action for related U.S. Appl. No. 17/846,487, dated Jun. 14, 2023.
Non-Final Office Action for related U.S. Appl. No. 16/958,821, dated Nov. 15, 2023.

* cited by examiner

DISPLAY SUBSTRATE AND MANUFACTURING METHOD THEREOF, AND DISPLAY DEVICE

CROSS-REFERENCE TO RELATED PATENT APPLICATIONS

This application is a U.S. National Stage Application under 35 U.S.C. § 371 of International Patent Application No. PCT/CN2019/102888, filed Aug. 27, 2019, which is incorporated by reference in its entirety.

TECHNICAL FIELD

At least one embodiment of the present disclosure relates to a display substrate and a manufacturing method thereof, and a display device.

BACKGROUND

With continuous development of a display device market, an Organic Light-emitting Diode (OLED) display becomes one of current mainstream display devices due to advantages of self-luminescence, high contrast ratio, small thickness, wide viewing angle, high response speed, bendability, wide operating temperature range and the like, and becomes a research hotspot of major manufacturers.

An OLED generally includes a first electrode, a second electrode and an organic electroluminescent element sandwiched between the two electrodes, the organic electroluminescent element includes a light-emitting functional layer, the light-emitting functional layer includes a light-emitting layer, the light-emitting functional layer may further include at least one selected from the group consisting of a hole transport layer, a hole injection layer, an electron transport layer and an electron injection layer, and the organic electroluminescent element can emit light under the electrical drive of the first electrode and the second electrode. Generally, a mainstream manufacturing process of the light-emitting functional layer is that the light-emitting functional layer is evaporated with a Fine Metal Mask (FMM), and the first electrode is produced by a sputtering process and an etching process.

Based on characteristics of Augmented Reality/Virtual Reality (AR/VR) products, it is demanded that a silicon-based OLED has a high resolution, but the high resolution will bring in high process difficulties.

SUMMARY

At least one embodiment of the present disclosure relates to a display substrate and a manufacturing method thereof, and a display device.

In the first aspect, at least one embodiment of the present disclosure provides a display substrate, the display substrate includes: a base substrate, a first insulation layer, a first electrode pattern, a connecting electrode pattern, a second electrode, a light-emitting functional layer and a first filling layer; the first insulation layer, located on the base substrate; the first electrode pattern is located in a display region of the display substrate, the first electrode pattern includes a plurality of first electrodes spaced apart from each other, and each of the plurality of first electrodes is configured to receive a pixel driving signal; the connecting electrode pattern is located in a peripheral region of the display substrate, the connecting electrode pattern surrounds the first electrode pattern; the second electrode is located in the display region and the peripheral region and connected with the connecting electrode pattern, the second electrode and the first electrode pattern are spaced apart from each other, and the second electrode is configured to receive a first power signal; the light-emitting functional layer is located between the first electrode pattern and the second electrode; and the first filling layer is located between the connecting electrode pattern and the first electrode pattern; the first filling layer and the light-emitting functional layer are different layers; and the first electrode pattern and the connecting electrode pattern are located at a side of the first insulation layer away from the base substrate, and are in contact with the first insulation layer, respectively; a portion of the first insulation layer that is located between the first electrode pattern and the connecting electrode pattern has a groove, and the first filling layer is at least partially located in the groove.

In the display substrate provided by an embodiment of the present disclosure, the first electrode pattern includes an edge first-electrode close to the connecting electrode pattern, and the insulation filling layer is in contact with the connecting electrode pattern and the edge first-electrode, respectively.

In the display substrate provided by an embodiment of the present disclosure, the connecting electrode pattern is of a ring shape.

In the display substrate provided by an embodiment of the present disclosure, the second electrode is in contact with the first filling layer.

In the display substrate provided by an embodiment of the present disclosure, the first filling layer includes an insulation layer.

In the display substrate provided by an embodiment of the present disclosure, the first filling layer includes at least one conductive filling portion and at least one insulation filling portion, the edge first-electrode is in contact with the insulation filling portion, and the edge first-electrode and the conductive filling portion are spaced apart from each other.

In the display substrate provided by an embodiment of the present disclosure, the first filling layer includes a plurality of conductive filling portions and a plurality of insulation filling portions, and the plurality of conductive filling portions and the plurality of insulation filling portions are alternatively arranged.

In the display substrate provided by an embodiment of the present disclosure, at least two selected from the group consisting of a pattern density of the plurality of conductive filling portions, a pattern density of the connecting electrode pattern, and a pattern density of the first electrode pattern are the same.

The display substrate provided by an embodiment of the present disclosure further includes a pixel defining layer, the pixel defining layer includes a plurality of pixel defining portions, and each of the plurality of pixel defining portions is located between adjacent first electrodes.

In the display substrate provided by an embodiment of the present disclosure, the first filling layer or at least one insulation filling portion in the first filling layer is located in the same layer as the pixel defining layer.

In the display substrate provided by an embodiment of the present disclosure, the first electrode pattern and the connecting electrode pattern are located in the same layer.

The display substrate provided by an embodiment of the present disclosure further includes a second filling layer, the second filling layer includes at least one second filling portion, the connecting electrode pattern includes a plurality of connecting electrodes, and the second filling portion is located between adjacent connecting electrodes.

In the display substrate provided by an embodiment of the present disclosure, the second filling layer includes an insulation layer.

In the display substrate provided by an embodiment of the present disclosure, the second filling layer and the first filling layer are located in the same layer.

In the display substrate provided by an embodiment of the present disclosure, the light-emitting functional layer is in contact with the first filling layer.

In the display substrate provided by an embodiment of the present disclosure, the light-emitting functional layer is in contact with a part of the first filling layer.

In the display substrate provided by an embodiment of the present disclosure, the first electrode is an anode of a light-emitting element, and the second electrode is a cathode of the light-emitting element.

In the display substrate provided by an embodiment of the present disclosure, the base substrate includes a silicon wafer.

At least one embodiment of the present disclosure further provides a display device, including any display substrate as described in the first aspect.

At least one embodiment of the present disclosure further provides a manufacturing method of a display substrate, including: forming a first insulation layer on a base substrate; forming a first electrode pattern, the first electrode pattern being located in a display region of the display substrate, the first electrode pattern including a plurality of first electrodes spaced apart from each other, each of the plurality of first electrodes being configured to receive a pixel driving signal; forming a connecting electrode pattern, the connecting electrode pattern being located in a peripheral region of the display substrate, the connecting electrode pattern surrounding the first electrode pattern; forming a second electrode, the second electrode being located in the display region and the peripheral region, the second electrode being connected with the connecting electrode pattern, the second electrode and the first electrode pattern being spaced apart from each other, the second electrode being configured to receive a first power signal; forming a light-emitting functional layer, the light-emitting functional layer being located between the first electrode pattern and the second electrode; and forming a first filling layer, the first filling layer being located between the connecting electrode pattern and the first electrode pattern; the first filling layer and the light-emitting functional layer are different layers, the first electrode pattern and the connecting electrode pattern are located at a side of the first insulation layer away from the base substrate, and are in contact with the first insulation layer, respectively, a portion of the first insulation layer that is located between the first electrode pattern and the connecting electrode pattern has a groove, and the first filling layer is at least partially located in the groove.

In the manufacturing method of the display substrate provided by an embodiment of the present disclosure, the first electrode pattern includes an edge first-electrode close to the connecting electrode pattern, and the insulation filling layer is in contact with the connecting electrode pattern and the edge first-electrode, respectively.

In the manufacturing method of the display substrate provided by an embodiment of the present disclosure, the second electrode is in contact with the first filling layer.

The manufacturing method of the display substrate provided by an embodiment of the present disclosure further includes: forming a pixel defining layer, the pixel defining layer includes a plurality of pixel defining portions, the first electrode pattern includes a plurality of first electrodes spaced apart from each other, and each of the plurality of pixel defining portions is located between adjacent first electrodes.

In the manufacturing method of the display substrate provided by an embodiment of the present disclosure, the pixel defining layer and the first filling layer are formed by the same patterning process, and the first electrode pattern and the connecting electrode pattern are formed by the same patterning process.

In the manufacturing method of the display substrate provided by an embodiment of the present disclosure, forming the first filling layer includes: forming at least one conductive filling portion and forming at least one insulation filling portion; the first electrode pattern, the connecting electrode pattern and the at least one conductive filling portion are formed by the same patterning process; and the pixel defining layer and the at least one insulation filling portion are formed by the same patterning process.

The manufacturing method of the display substrate provided by an embodiment of the present disclosure further includes: forming a second filling layer, the second filling layer includes at least one second filling portion, the connecting electrode pattern includes a plurality of connecting electrodes, and each of the plurality of second filling portions is located between adjacent connecting electrodes; and the second filling layer is formed in the same patterning process for forming the pixel defining layer and the at least one insulation filling portion.

In the second aspect, at least one embodiment of the present disclosure provides a display substrate, including: a first electrode pattern, a connecting electrode pattern, a second electrode, and a light-emitting functional layer; the first electrode pattern is located in a display region of the display substrate and includes a plurality of first electrodes spaced apart from each other, each of the plurality of first electrodes is configured to receive a pixel driving signal; the connecting electrode pattern is located in a peripheral region of the display substrate and includes a plurality of connecting electrodes; the second electrode is located in the display region and the peripheral region and connected with the connecting electrode pattern, the second electrode and the first electrode pattern are spaced apart from each other, and the second electrode is configured to receive a first power signal; and the light-emitting functional layer is located between the first electrode pattern and the second electrode; the connecting electrode pattern surrounds the first electrode pattern, and at least two of the plurality of connecting electrodes are each of a block shape and are spaced apart from each other.

The display substrate provided by an embodiment of the present disclosure further includes a base substrate and a first insulation layer located on the base substrate, the first electrode pattern and the connecting electrode pattern are located at a side of the first insulation layer away from the base substrate, and are in contact with the first insulation layer, respectively.

In the display substrate provided by an embodiment of the present disclosure, a portion of the first insulation layer that is located between adjacent first electrodes has a first groove, a portion of the first insulation layer that is located between adjacent connecting electrodes has a second groove, and sizes of the first groove and the second groove in a direction perpendicular to the base substrate are equal.

In the display substrate provided by an embodiment of the present disclosure, a shape of each of the plurality of the connecting electrodes is the same as that of the first electrode.

In the display substrate provided by an embodiment of the present disclosure, a pattern density of the connecting electrode pattern is the same as that of the first electrode pattern.

The display substrate provided by an embodiment of the present disclosure, further includes a first dummy electrode pattern, the first dummy electrode pattern includes a plurality of first dummy electrodes; and the first dummy electrode pattern is located between the connecting electrode pattern and the first electrode pattern, and a shape of each of the plurality of first dummy electrodes is the same as that of the first electrode.

In the display substrate provided by an embodiment of the present disclosure, a pattern density of the first dummy electrode pattern is the same as that of the first electrode pattern.

In the display substrate provided by an embodiment of the present disclosure, a via hole is not provided in a portion of the first insulation layer which overlaps with the plurality of first dummy electrodes in a direction perpendicular to the base substrate.

The display substrate provided by an embodiment of the present disclosure further includes a second dummy electrode pattern, the second dummy electrode pattern includes a plurality of second dummy electrodes; and the second dummy electrode pattern is located at a side of the connecting electrode pattern away from the first electrode pattern, and a shape of each of the plurality of second dummy electrodes is the same as that of the first electrode.

In the display substrate provided by an embodiment of the present disclosure, a pattern density of the second dummy electrode pattern is the same as that of the first electrode pattern.

In the display substrate provided by an embodiment of the present disclosure, a via hole is not provided in a portion of the first insulation layer which overlaps with the plurality of second dummy electrodes in a direction perpendicular to the base substrate.

The display substrate provided by an embodiment of the present disclosure further includes an insulation filling layer, the insulation filling layer covers the plurality of first dummy electrodes, the plurality of first dummy electrodes and the insulation filling layer constitute a first filling layer, the first electrode pattern includes an edge first-electrode close to the plurality of connecting electrodes, and the insulation filling layer is in contact with the plurality of connecting electrodes and the edge first-electrode, respectively.

In the display substrate provided by an embodiment of the present disclosure, the second electrode is in contact with the insulation filling layer.

In the display substrate provided by an embodiment of the present disclosure, the edge first-electrode and the plurality of first dummy electrodes are insulated from each other.

The display substrate provided by an embodiment of the present disclosure further includes a pixel defining layer, the pixel defining layer includes a plurality of pixel defining portions, and each of the plurality of pixel defining portions is located between adjacent first electrodes.

In the display substrate provided by an embodiment of the present disclosure, the insulation filling layer and the pixel defining layer are located in the same layer.

The display substrate provided by an embodiment of the present disclosure further includes a second filling layer, the second filling layer includes at least one second filling portion, and the second filling portion is located between adjacent connecting electrodes.

In the display substrate provided by an embodiment of the present disclosure, the second filling portion is in contact with the adjacent connecting electrodes, respectively.

In the display substrate provided by an embodiment of the present disclosure, the second filling layer includes an insulation layer.

In the display substrate provided by an embodiment of the present disclosure, the second filling layer and the insulation filling layer are located in the same layer.

In the display substrate provided by an embodiment of the present disclosure, the insulation filling layer includes a plurality of insulation filling portions, and each of the plurality of insulation filling portions is located between adjacent first dummy electrodes.

In the display substrate provided by an embodiment of the present disclosure, the light-emitting functional layer is in contact with the first filling layer.

In the display substrate provided by an embodiment of the present disclosure, the light-emitting functional layer is in contact with a part of the first filling layer.

In the display substrate provided by an embodiment of the present disclosure, the connecting electrode pattern is of a ring shape.

In the display substrate provided by an embodiment of the present disclosure, the first electrode is an anode of a light-emitting element, and the second electrode is a cathode of the light-emitting element.

In the display substrate provided by an embodiment of the present disclosure, the base substrate includes a silicon wafer.

At least one embodiment of the present disclosure further provides a display device, including any display substrate as described in the second aspect.

At least one embodiment of the present disclosure further provides a manufacturing method of a display substrate, including: forming a first electrode pattern, the first electrode pattern being located in a display region of the display substrate and including a plurality of first electrodes spaced apart from each other, each of the plurality of first electrodes being configured to receive a pixel driving signal; forming a connecting electrode pattern, the connecting electrode pattern being located in a peripheral region of the display substrate and including a plurality of connecting electrodes; forming a second electrode, the second electrode being located in the display region and the peripheral region and connected with the connecting electrode pattern, the second electrode and the first electrode pattern being spaced apart from each other, and the second electrode being configured to receive a first power signal; and forming a light-emitting functional layer, the light-emitting functional layer being located between the first electrode pattern and the second electrode; the connecting electrode pattern surrounds the first electrode pattern, and at least two of the plurality of connecting electrodes are each of a block shape and are spaced apart from each other.

In the manufacturing method of the display substrate provided by an embodiment of the present disclosure, a pattern density of the connecting electrode pattern is the same as that of the first electrode pattern.

The manufacturing method of the display substrate provided by an embodiment of the present disclosure further includes: forming a first dummy electrode pattern, the first dummy electrode pattern includes a plurality of first dummy electrodes; the first dummy electrode pattern is located between the connecting electrode pattern and the first electrode pattern; and a pattern density of the first dummy electrode pattern is the same as that of the first electrode pattern.

The manufacturing method of the display substrate provided by an embodiment of the present disclosure further includes: forming an insulation filling layer, the insulation filling layer covers the plurality of first dummy electrodes, the plurality of first dummy electrodes and the insulation filling layer constitute a first filling layer, the first electrode pattern includes an edge first-electrode close to the plurality of connecting electrodes, and the insulation filling layer is in contact with the plurality of connecting electrodes and the edge first-electrode, respectively.

The manufacturing method of the display substrate provided by an embodiment of the present disclosure further includes: forming a second dummy electrode pattern, the second dummy electrode pattern includes a plurality of second dummy electrodes; and the second dummy electrode pattern is located at a side of the connecting electrode pattern away from the first electrode pattern, and a pattern density of the second dummy electrode pattern is the same as that of the first electrode pattern.

The manufacturing method of the display substrate provided by an embodiment of the present disclosure further includes: forming a pixel defining layer, the pixel defining layer includes a plurality of pixel defining portions, and each of the plurality of pixel defining portions is located between adjacent first electrodes.

The manufacturing method of the display substrate provided by an embodiment of the present disclosure further includes: forming a second filling layer, the second filling layer includes at least one second filling portion, and the second filling portion is located between adjacent connecting electrodes.

The manufacturing method of the display substrate provided by an embodiment of the present disclosure further includes: forming a first dummy electrode pattern, a second dummy electrode pattern, a pixel defining layer, an insulation filling layer and a second filling layer; the first dummy electrode pattern includes a plurality of first dummy electrodes, and the first dummy electrode pattern is located between the connecting electrode pattern and the first electrode pattern; the second dummy electrode pattern includes a plurality of second dummy electrodes; the second dummy electrode pattern is located at a side of the connecting electrode pattern away from the first electrode pattern; the pixel defining layer includes a plurality of pixel defining portions, and each of the plurality of pixel defining portions is located between adjacent first electrodes; the insulation filling layer covers the plurality of first dummy electrodes; the second filling layer includes at least one second filling portion, and the second filling portion is located between adjacent connecting electrodes; the pixel defining layer, the insulation filling layer and the second filling layer are formed by the same patterning process; and the first electrode pattern, the connecting electrode pattern, the first dummy electrode pattern and the second dummy electrode pattern are formed by the same patterning process.

In the manufacturing method of the display substrate provided by an embodiment of the present disclosure, the insulation filling layer includes a plurality of insulation filling portions, and each of the plurality of insulation filling portions is located between adjacent first dummy electrodes.

In the third aspect, at least one embodiment of the present disclosure provides a display substrate, including: a first electrode pattern, a connecting electrode pattern, a second electrode, a light-emitting functional layer, and a first dummy electrode pattern; the first electrode pattern is located in a display region of the display substrate and includes a plurality of first electrodes spaced apart from each other, each of the plurality of first electrodes is configured to receive a pixel driving signal; the connecting electrode pattern is located in a peripheral region of the display substrate; the second electrode is located in the display region and the peripheral region and connected with the connecting electrode pattern, the second electrode and the first electrode pattern are spaced apart from each other, the second electrode is configured to receive a first power signal; the light-emitting functional layer is located between the first electrode pattern and the second electrode; and the first dummy electrode pattern includes a plurality of first dummy electrodes; the connecting electrode pattern surrounds the first electrode pattern, the first dummy electrode pattern is located between the connecting electrode pattern and the first electrode pattern, and at least two of the plurality of first dummy electrodes are each of a block shape and are spaced apart from each other.

The display substrate provided by an embodiment of the present disclosure further includes a base substrate and a first insulation layer located on the base substrate, the first electrode pattern, the connecting electrode pattern, and the first dummy electrode pattern are located at a side of the first insulation layer away from the base substrate, and are in contact with the first insulation layer, respectively.

In the display substrate provided by an embodiment of the present disclosure, a via hole is not provided in a portion of the first insulation layer which overlaps with the plurality of first dummy electrodes in a direction perpendicular to the base substrate.

In the display substrate provided by an embodiment of the present disclosure, each of the plurality of first dummy electrodes is floated.

In the display substrate provided by an embodiment of the present disclosure, the connecting electrode pattern includes a plurality of connecting electrodes, and each of the plurality of connecting electrode is of a block shape.

In the display substrate provided by an embodiment of the present disclosure, a shape of the connecting electrode is the same as that of the first electrode, and a shape of the first dummy electrode is the same as that of the first electrode.

In the display substrate provided by an embodiment of the present disclosure, a pattern density of the connecting electrode pattern is the same as that of the first electrode pattern, and a pattern density of the first dummy electrode pattern is the same as that of the first electrode pattern.

The display substrate provided by an embodiment of the present disclosure further includes a second dummy electrode pattern, the second dummy electrode pattern includes a plurality of second dummy electrodes; and the second dummy electrode pattern is located at a side of the connecting electrode pattern away from the first electrode pattern.

In the display substrate provided by an embodiment of the present disclosure, a via hole is not provided in a portion of the first insulation layer which overlaps with the plurality of second dummy electrodes in a direction perpendicular to the base substrate.

In the display substrate provided by an embodiment of the present disclosure, each of the plurality of second dummy electrodes is of a block shape, and a shape of the second dummy electrode is the same as that of the first electrode.

In the display substrate provided by an embodiment of the present disclosure, a pattern density of the second dummy electrode pattern is the same as that of the first electrode pattern.

In the display substrate provided by an embodiment of the present disclosure, at least one selected from the group consisting of a portion of the first insulation layer, located between adjacent first electrodes, and a portion of the first insulation layer, located between adjacent connecting electrodes, has a groove.

The display substrate provided by an embodiment of the present disclosure further includes an insulation filling layer, the insulation filling layer covers the plurality of first dummy electrodes, the plurality of first dummy electrodes and the insulation filling layer constitute a first filling layer, the first electrode pattern includes an edge first-electrode close to the connecting electrode, and the insulation filling layer is in contact with the connecting electrode and the edge first-electrode, respectively.

In the display substrate provided by an embodiment of the present disclosure, the second electrode is in contact with the insulation filling layer.

In the display substrate provided by an embodiment of the present disclosure, the second electrode is in contact with the insulation filling layer.

In the display substrate provided by an embodiment of the present disclosure, the edge first-electrode and the plurality of first dummy electrodes are insulated from each other.

The display substrate provided by an embodiment of the present disclosure further includes a pixel defining layer, the pixel defining layer includes a plurality of pixel defining portions, and each of the plurality of pixel defining portions is located between adjacent first electrodes.

In the display substrate provided by an embodiment of the present disclosure, the insulation filling layer and the pixel defining layer are located in the same layer.

The display substrate provided by an embodiment of the present disclosure further includes a second filling layer, the second filling layer includes at least one second filling portion, and the second filling portion is located between adjacent connecting electrodes.

In the display substrate provided by an embodiment of the present disclosure, the second filling portion is in contact with the adjacent connecting electrodes, respectively.

In the display substrate provided by an embodiment of the present disclosure, the second filling layer includes an insulation layer.

In the display substrate provided by an embodiment of the present disclosure, the second filling layer and the insulation filling layer are located in the same layer.

The display substrate provided by an embodiment of the present disclosure further includes a sensor electrode pattern, the sensor electrode pattern includes a plurality of sensor electrodes; and each of the plurality of sensor electrodes is of a block shape, and the sensor electrode is configured to receive a detection driving signal.

In the display substrate provided by an embodiment of the present disclosure, a shape of the sensor electrode is the same as that of the first electrode.

In the display substrate provided by an embodiment of the present disclosure, a pattern density of the sensor electrode pattern is the same as that of the first electrode pattern.

The display substrate provided by an embodiment of the present disclosure further includes a third filling layer, the third filling layer includes a plurality of third filling portions, and each of the plurality of third filling portions is located between at least one selected from the group consisting of adjacent sensor electrodes, and adjacent sensor electrode and first dummy electrode.

In the display substrate provided by an embodiment of the present disclosure, the light-emitting functional layer is in contact with the first filling layer.

In the display substrate provided by an embodiment of the present disclosure, the light-emitting functional layer is in contact with a part of the first filling layer.

In the display substrate provided by an embodiment of the present disclosure, the connecting electrode pattern is of a ring shape.

In the display substrate provided by an embodiment of the present disclosure, the first electrode is an anode of a light-emitting element, and the second electrode is a cathode of the light-emitting element.

In the display substrate provided by an embodiment of the present disclosure, the base substrate includes a silicon wafer.

At least one embodiment of the present disclosure further provides a display device, including any display substrate as described in the third aspect.

At least one embodiment of the present disclosure further provides a manufacturing method of a display substrate, including: forming a first electrode pattern, the first electrode pattern being located in a display region of the display substrate and including a plurality of first electrodes spaced apart from each other, the first electrode being configured to receive a pixel driving signal; forming a connecting electrode pattern, the connecting electrode pattern being located in a peripheral region of the display substrate; forming a second electrode, the second electrode being located in the display region and the peripheral region and connected with the connecting electrode pattern, the second electrode and the first electrode pattern being spaced apart from each other, and the second electrode being configured to receive a first power signal; forming a light-emitting functional layer, the light-emitting functional layer being located between the first electrode pattern and the second electrode; and forming a first dummy electrode pattern, the first dummy electrode pattern including a plurality of first dummy electrodes; the connecting electrode pattern surrounds the first electrode pattern, the first dummy electrode pattern is located between the connecting electrode pattern and the first electrode pattern, and at least two of the plurality of first dummy electrodes are each of a block shape and are spaced apart from each other.

In the manufacturing method of the display substrate provided by an embodiment of the present disclosure, each of the plurality of first dummy electrodes is of a block shape, and a pattern density of the first dummy electrode pattern is the same as that of the first electrode pattern.

The manufacturing method of the display substrate provided by an embodiment of the present disclosure further includes: forming a second dummy electrode pattern, the second dummy electrode pattern includes a plurality of second dummy electrodes; and the second dummy electrode pattern is located at a side of the connecting electrode pattern away from the first electrode pattern, and a pattern density of the second dummy electrode pattern is the same as that of the first electrode pattern.

The manufacturing method of the display substrate provided by an embodiment of the present disclosure further includes: forming an insulation filling layer, the insulation filling layer covers the plurality of first dummy electrodes, the plurality of first dummy electrodes and the insulation filling layer constitute a first filling layer, the first electrode pattern includes an edge first-electrode close to the connecting electrode, and the insulation filling layer is in contact with the connecting electrode and the edge first-electrode, respectively.

The manufacturing method of the display substrate provided by an embodiment of the present disclosure further includes: forming a sensor electrode pattern, the sensor electrode pattern includes a plurality of sensor electrodes, and each of the plurality of sensor electrodes is of a block shape, and a pattern density of the sensor electrode pattern is the same as that of the first electrode pattern.

The manufacturing method of the display substrate provided by an embodiment of the present disclosure further includes: forming a pixel defining layer, the pixel defining layer includes a plurality of pixel defining portions, and each of the plurality of pixel defining portions is located between adjacent first electrodes.

The manufacturing method of the display substrate provided by an embodiment of the present disclosure further includes: forming a second filling layer, the second filling layer includes at least one second filling portion, and the second filling portion is located between adjacent connecting electrodes.

The manufacturing method of the display substrate provided by an embodiment of the present disclosure further includes: forming a third filling layer, the third filling layer includes a plurality of third filling portions, and the third filling portion is located between at least one selected from the group consisting of adjacent sensor electrodes, and adjacent sensor electrode and first dummy electrode.

The manufacturing method of the display substrate provided by an embodiment of the present disclosure further includes: forming a second dummy electrode pattern, a sensor electrode pattern, a pixel defining layer, an insulation filling layer, a second filling layer and a third filling layer; the sensor electrode pattern includes a plurality of sensor electrodes; the second dummy electrode pattern includes a plurality of second dummy electrodes; the second dummy electrode pattern is located at a side of the connecting electrode pattern away from the first electrode pattern; the pixel defining layer includes a plurality of pixel defining portions, and each of the plurality of pixel defining portions is located between adjacent first electrodes; the insulation filling layer covers the plurality of first dummy electrodes; the second filling layer includes at least one second filling portion, and the second filling portion is located between adjacent connecting electrodes; the third filling layer includes a plurality of third filling portions, and each of the plurality of third filling portions is located between at least one selected from the group consisting of adjacent sensor electrodes, and adjacent sensor electrode and first dummy electrode; the pixel defining layer, the insulation filling layer, the second filling layer and the third filling layer are formed by the same patterning process; and the first electrode pattern, the connecting electrode pattern, the first dummy electrode pattern, the second dummy electrode pattern and the sensor electrode pattern are formed by the same patterning process.

In the manufacturing method of the display substrate provided by an embodiment of the present disclosure, the insulation filling layer includes a plurality of insulation filling portions, and each of the plurality of insulation filling portions is located between adjacent first dummy electrodes.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

Figure 1:
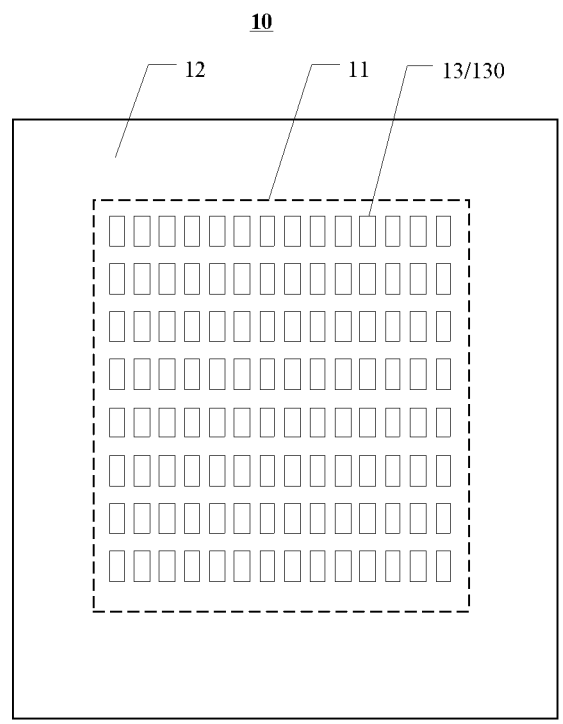
FIG. 1 is a schematic planar diagram of an OLED display substrate.

In order to make objectives, technical details and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

In a manufacturing process of an OLED display device, a manufacturing process of a first electrode generally includes: forming a conductive layer on a base substrate by a sputtering process; forming a photoresist pattern at a side of the conductive layer away from the base substrate; and etching the conductive layer by using the photoresist pattern as a mask so as to form a first electrode pattern, and removing the photoresist pattern. For example, a material of the conductive layer includes indium tin oxide, without limited thereto.

During the research, inventor(s) of the application found that in the process of etching a conductive layer, the first electrode pattern needs to be formed in a display region of the OLED display device, a portion of the conductive layer in a peripheral region of the OLED display device needs to be totally or partially removed, and the display region and the peripheral region are different in pattern density, resulting in that under the same dry-etching process, within unit area, amounts of the conductive materials which need to be etched away from the display region and the peripheral region are quite different. The dry-etching process is poor in selectivity, so that on the one hand, it is easy to cause a difficulty on controlling a process film thickness and size evenness of the finally formed first electrode pattern, and on the other hand, it is easy to cause an over-etching phenomenon of an insulation layer under the first electrode pattern.

FIG. 1 is a schematic planar diagram of an OLED display substrate. As illustrated in FIG. 1, the OLED display substrate 10 includes a display region 11 and a peripheral region 12 surrounding the display region 11; the display region 11 is provided with a first electrode pattern 13; and the first electrode pattern 13 includes a plurality of first electrodes 130 so as to drive a light-emitting layer (not illustrated) in the OLED display substrate 10 to emit light.

Figure 2A:
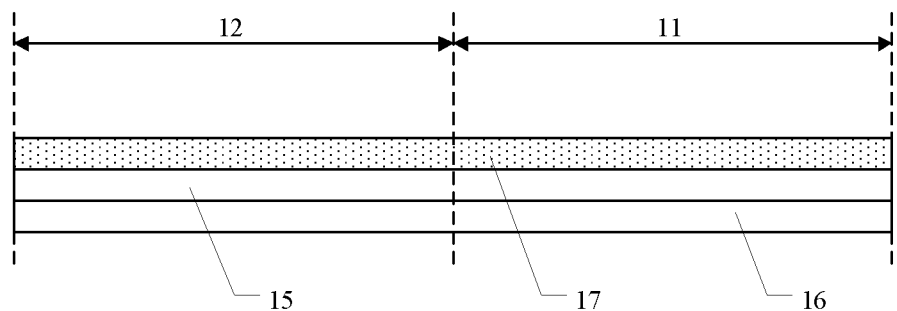
FIG. 2A to FIG. 2D are schematic diagrams of a manufacturing method of a first electrode pattern in an OLED display substrate.
Figure 2B:
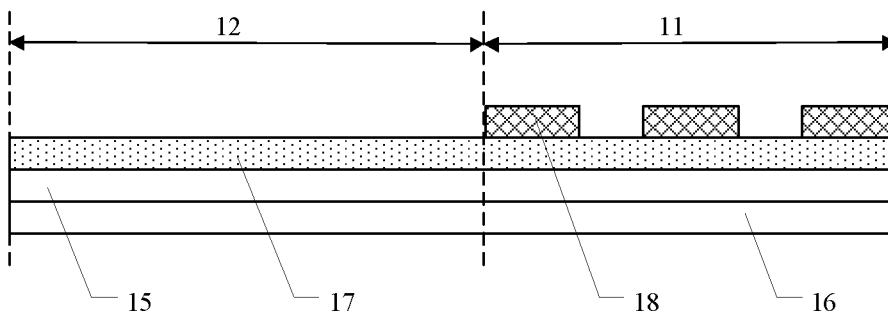
Figure 2C:
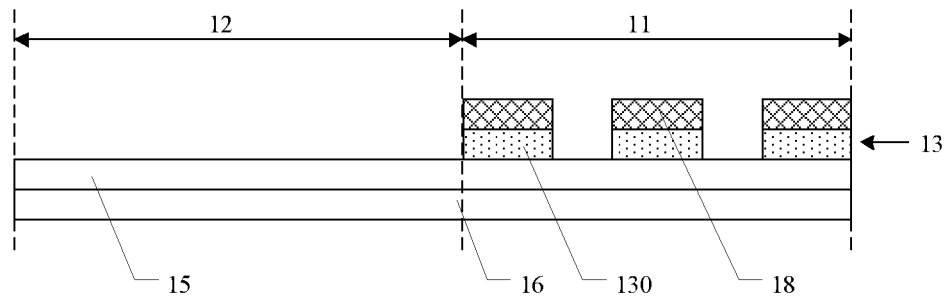
Figure 2D:
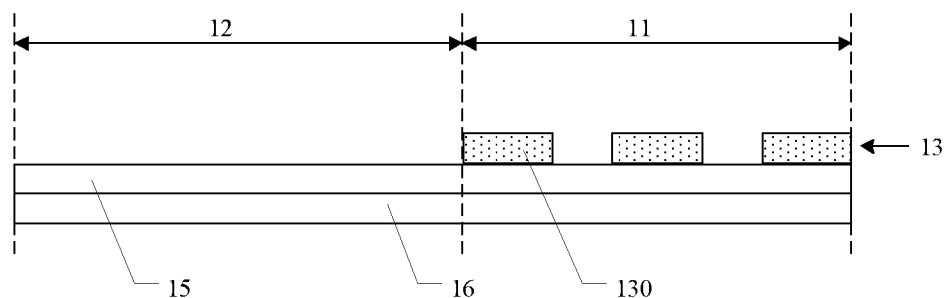

FIG. 2A to FIG. 2D are schematic diagrams of a manufacturing method of a first electrode pattern in an OLED display substrate. As illustrated in FIG. 2A, forming an insulation layer 15 on a base substrate 16, and forming a conductive layer 17 at a side of the insulation layer 15 away from the base substrate 16; as illustrated in FIG. 2B, forming a photoresist pattern 18 at a side of the conductive layer 17 away from the insulation layer 15; as illustrated in FIG. 2C, etching the conductive layer 17 by using the photoresist pattern 18 as a mask so as to form the first electrode pattern 13; and as illustrated in FIG. 2D, stripping off the photoresist pattern 18.

As illustrated in FIG. 1 and FIG. 2A to FIG. 2D, the OLED display substrate includes the display region and the peripheral region; a portion of the conductive layer, which is located in the display region, is dry-etched to form the first electrode pattern; while a portion of the conductive layer, which is located in the peripheral region, is completely removed, resulting in that under the same dry-etching process, within unit area, amounts of the conductive materials which need to be etched away from the display region and the peripheral region are quite different, thereby causing unevenness of etching. In the case where etching parameters (e.g., a concentration, a flow rate and the like of a dry-etching gas) sufficient for etching away the portion of the conductive layer, which is located in the peripheral region, are provided, the portion of the conductive layer, which is located in the display region, is easy to be over-etched to generate an over-etching phenomenon, resulting in that the process film thickness and the size evenness of the formed first electrode pattern are difficult to control, and on the other hand, due to poor selectivity of the etching process, it is easy to cause the insulation layer under the first electrode pattern to be also etched to generate various defects.

Generally, a pattern density of a conductive pattern in the peripheral region is different from that of the first electrode pattern in the display region, and the pattern densities of the peripheral region and the display region are quite different. For example, the pattern density of the conductive pattern in the peripheral region is smaller than that of the first electrode pattern in the display region, and the conductive pattern may not be arranged in the peripheral region or a small amount of conductive pattern may be arranged in the peripheral region. When the conductive layer 17 is dry-etched, concentrations of an active group, a side wall protective substance and the like near the surface of the conductive layer 17 in the display region and the peripheral region are evenly distributed, and thus, the active group and the side wall protective substance within unit area in a region with a high pattern density are more than those within unit area in a region with a low pattern density, so that an etching depth of the region with the high pattern density is smaller than that of the region with the low pattern density, which is the so-called loading effect, resulting in that an etching depth of the peripheral region is greater than that of the display region, which can cause a large difference in loss amounts of a part of the insulation layer material below a portion of the conductive layer 17, which is located in the peripheral region, and a part of the insulation layer material below a portion of the conductive layer 17, which is located in the display region.

The inventor(s) found that the loss amount of a portion of the insulation layer 15, which is located in the peripheral region 12, is greater than that of a portion of the insulation layer 15, which is located in the display region 11. When the loss amount of the portion of the insulation layer 15, which is located in the peripheral region 12, is relatively large, it is easy to cause a short circuit or poor contact of a subsequent film layer.

Figure 3:
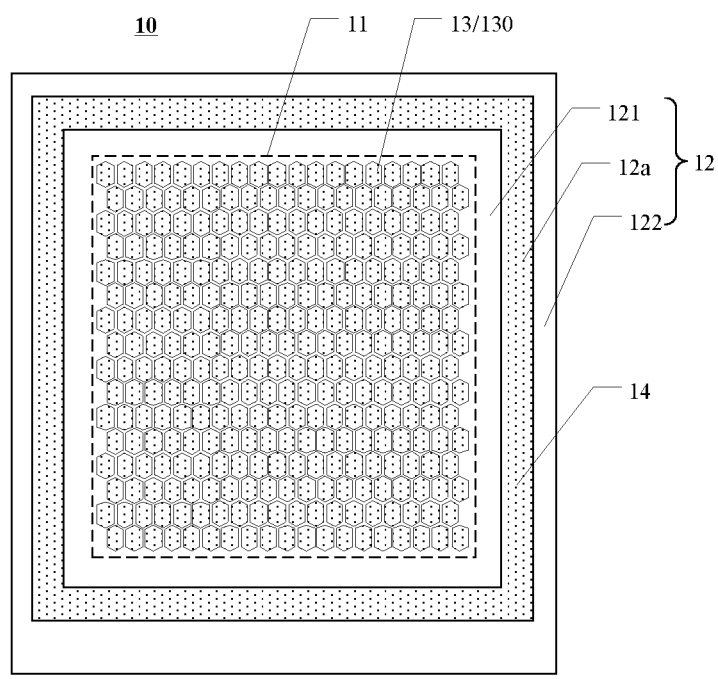
FIG. 3 is a schematic planar diagram of an OLED display substrate.

FIG. 3 is a schematic planar diagram of an OLED display substrate. Compared with the display substrate illustrated in FIG. 1, a peripheral region 12 of the display substrate illustrated in FIG. 3 includes a connecting electrode region 12a, so that the peripheral region 12 includes three regions: the connecting electrode region 12a, a first dummy region 121 and a second dummy region 122. The first dummy region 121 is located between the connecting electrode region 12a and a display region 11, and the second dummy region 122 is located at a side of the connecting electrode region 12a away from the display region 11. As illustrated in FIG. 3, the second dummy region 122 is located at a side of the connecting electrode region 12a away from the first dummy region 121. The first dummy region 121 is provided to avoid the short circuit of elements in the display region and the connecting electrode region 12a, which need to be insulated from each other, and the second dummy region 122 is provided to facilitate encapsulation the display substrate and improving an encapsulation effect.

Figure 4:
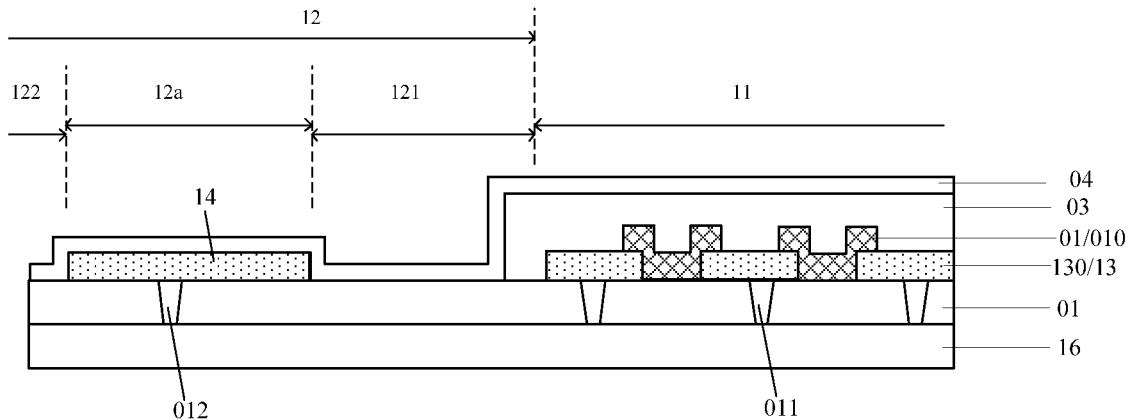
FIG. 4 is a schematic cross-sectional view of an OLED display substrate.

FIG. 4 is a schematic cross-sectional view of an OLED display substrate. FIG. 4 may be a cross-sectional view of FIG. 3. As illustrated in FIG. 4, an insulation layer 01 is arranged on the base substrate 16, a via hole 011 and a via hole 012 are disposed in the insulation layer 01, the via hole 011 and the via hole 012 are filled with a conductive material to form connecting elements, respectively, and the conductive material includes metal, e.g., tungsten, without limited thereto. A connecting electrode 14 and the first electrode pattern 13 which are located in the same layer are arranged on the insulation layer 01. The first electrode pattern 13 includes a plurality of first electrodes 130. The first electrode 130 is connected with an element below the first electrode, e.g., a drain electrode (not illustrated) of a thin film transistor, by the connecting element in the via hole 011, and the connecting electrode 14 is connected with a connecting line (not illustrated) below the connecting electrode by the connecting element in the via hole 012. As illustrated in FIG. 4, a pixel defining layer 01 is formed after the connecting electrode 14 and the first electrode pattern 13 are formed, the pixel defining layer 01 includes a plurality of pixel defining portions 010, and one of the plurality of pixel defining portions 010 is arranged between adjacent first electrodes 130. For example, the plurality of pixel defining portions 010 can be connected with each other and integrally formed, without limited thereto. The pixel defining layer 01 may include a plurality of hollow regions so as to expose the plurality of first electrodes 130, respectively. The pixel defining layer 01 is configured to define a plurality of sub pixels. For example, each hollow region corresponds to one sub pixel. For example, each first electrode 130 corresponds to one sub pixel. As illustrated in FIG. 4, a light-emitting functional layer 03 is formed after the pixel defining layer 01 is formed, and the light-emitting functional layer 03 covers the first electrode pattern 13 and the pixel defining layer 01. As illustrated in FIG. 4, after the light-emitting functional layer 03 is formed, a second electrode 04 is formed, and the second electrode 04 is spaced apart from the first electrode pattern 13 so as to avoid a direct connection of the second electrode 04 and the first electrode 130, and the second electrode 04 is connected with the connecting electrode 14. For example, the first electrode 130 can be produced by adopting a transparent conductive material, and for example, the transparent conductive material includes indium tin oxide, without limited thereto.

When the connecting electrode and the first electrode pattern are formed in the same layer, a portion of a conductive layer, which is located in the first dummy region 121, and a portion of the conductive layer, which is located in the second dummy region 122, need to be etched away in an integral block mode, and thus, there is also an etching unevenness problem in the process.

As illustrated in FIG. 4, at a boundary position of the light-emitting functional layer 03, which is close to the connecting electrode region 12a, the second electrode 04 has a large height fall, which is easy to cause fracture of the second electrode and reduce connection reliability between the second electrode and the connecting electrode. Generally, the display substrate has the pixel defining layer only in the display region, and has no pixel defining layer material in the peripheral region (a non-pixel region), resulting in uneven contact between the second electrode and the connecting electrode. The second electrode can be produced by adopting a metal. For example, the second electrode can be produced by adopting a metal material such as at least one of magnesium, silver and the like, without limited thereto, and can be determined as required.

In order to solve at least one of the above-mentioned problems that the second electrode has a large height fall, which is easy to cause a fracture of the second electrode and reduces connection reliability between the second electrode and the connecting electrode, and etching is uneven, embodiments of the present disclosure provide a display substrate and a manufacturing method thereof, and a display device.

In a first aspect, according to the embodiments of the present disclosure, a height fall of a second electrode 106 is reduced and/or etching evenness is improved by arranging a first filling layer 104a.

Figure 5A:
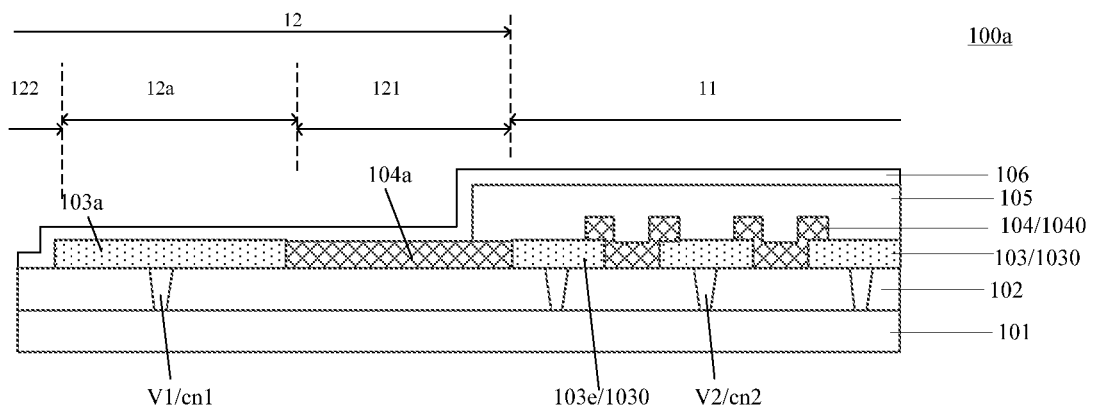
FIG. 5A is a cross-sectional view of a display substrate provided by an embodiment of the present disclosure.

FIG. 5A is a cross-sectional view of a display substrate provided by an embodiment of the present disclosure. As illustrated in FIG. 5A, a display substrate 100a includes: a first electrode pattern 103, a connecting electrode pattern 103a, a second electrode 106 and a first filling layer 104a. The connecting electrode pattern 103a surrounds the first electrode pattern 103 (with reference to FIG. 3). The second electrode 106 is connected with the connecting electrode pattern 103a. The second electrode 106 is spaced apart from the first electrode pattern 103. The second electrode 106 is configured to receive a first power signal. The first filling layer 104a is located between the connecting electrode pattern 103a and the first electrode pattern 103.

For example, as illustrated in FIG. 5A, the second electrode 106 is not in contact with the first electrode pattern 103. For example, as illustrated in FIG. 5A, the display substrate includes a base substrate 101. The second electrode 106 and the first electrode pattern 103 are spaced apart from each other in a direction parallel with the base substrate 101, and the second electrode 106 and the first electrode pattern 103 are spaced apart from each other in a direction perpendicular to the base substrate 101. For example, the connecting electrode pattern 103a and the first electrode pattern 103 are spaced apart from each other in the direction parallel with the base substrate 101.

As illustrated in FIG. 5A, the display substrate 100a includes: a display region 11 and a peripheral region 12, the peripheral region 12 surrounding the display region 11. The first electrode pattern 103 is located in the display region 11 of the display substrate; and the connecting electrode pattern 103a is located in the peripheral region 12 of the display substrate, and the second electrode 106 is located in the display region 11 and the peripheral region 12. For example, the second electrode 106 is of a block shape, and extends to the peripheral region 12 from the display region 11.

According to the display substrate provided by the embodiment of the present disclosure, by arranging the first filling layer 104a, the height fall of the second electrode 106 can be reduced, and connection reliability between the second electrode 106 and the connecting electrode pattern 103a can be improved.

For example, as illustrated in FIG. 5A, the first electrode pattern 103 includes a plurality of first electrodes 1030 spaced apart from each other, and the first electrode 1030 is configured to receive a pixel driving signal. The first electrode pattern 103 includes an edge first-electrode 103e, the edge first-electrode 103e is close to the connecting electrode pattern 103a, the first filling layer 104a is in contact with the connecting electrode pattern 103a and the edge first-electrode 103e, respectively, and for example, the first filling layer 104a is an insulation layer, so as to facilitate mutual spacing of the edge first-electrode 103e and the second electrode 106. For example, the edge first-electrode 103e is a first electrode 1030 which is closest to the connecting electrode pattern 103a.

As illustrated in FIG. 5A, in the display substrate provided by an embodiment of the present disclosure, a side surface of the first filling layer 104a is in contact with a side surface of the connecting electrode pattern 103a and a side surface of the edge first-electrode 103e, respectively.

As illustrated in FIG. 5A, in the display substrate provided by an embodiment of the present disclosure, in order to reduce the height fall of the second electrode, the second electrode 106 is in contact with the first filling layer 104a.

Figure 5B:
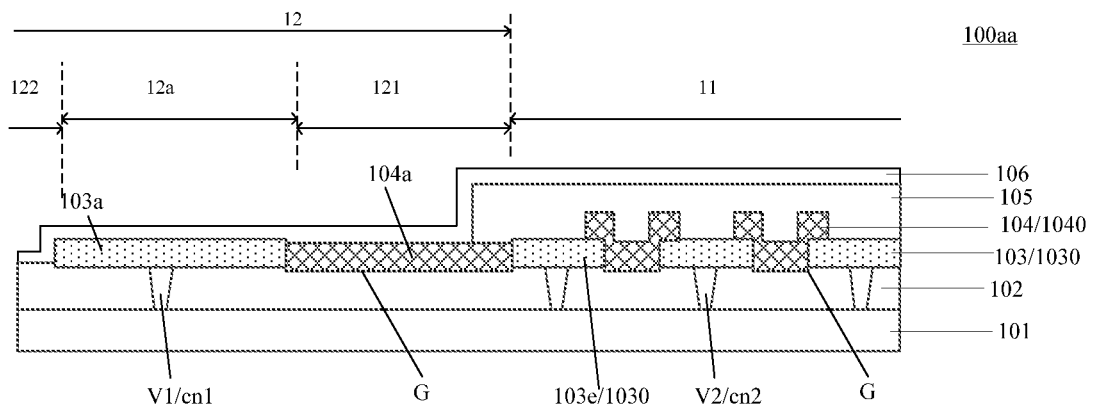
FIG. 5B is a cross-sectional view of a display substrate provided by an embodiment of the present disclosure.

FIG. 5B is a cross-sectional view of a display substrate provided by an embodiment of the present disclosure. Compared with the display substrate 100a illustrated in FIG. 5A, the display substrate 100aa illustrated in FIG. 5B differs in that a groove G is disposed in the first insulation layer 102 of the display substrate 100aa. The groove G is formed in the process of etching a conductive thin film, and the groove G is provided to facilitate spacing adjacent first electrodes apart from each other and improving stability of the etching process. As illustrated in FIG. 5B, a size of the groove G in the first insulation layer 102, which is located between the edge first-electrode 103e and the connecting electrode pattern 103a, in the direction perpendicular to the base substrate 101 is greater than that of the groove G in the first insulation layer 102, which is located between adjacent first electrodes 1030, or the groove G in the first insulation layer 102, which is located between adjacent first electrodes 1030, in the direction perpendicular to the base substrate 101. As illustrated in FIG. 5B, a portion of the first filling layer 104a is filled in the groove G between the edge first-electrode 103e and the connecting electrode pattern 103a.

Figure 6A:
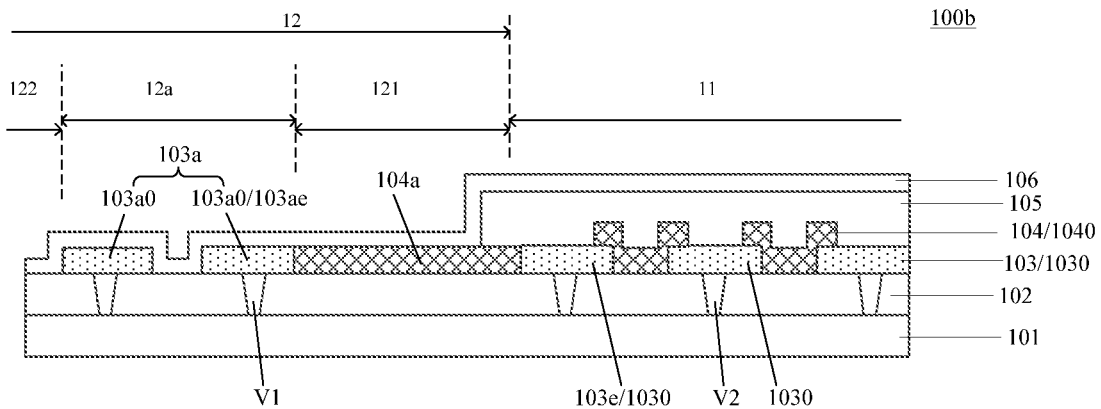
FIG. 6A is a schematic cross-sectional view of a display substrate provided by an embodiment of the present disclosure.

FIG. 6A is a schematic cross-sectional view of a display substrate provided by an embodiment of the present disclosure. As illustrated in FIG. 6A, Compared with the display substrate 100a, the display substrate 100b differs in that the connecting electrode pattern 103a includes a plurality of connecting electrodes 103a0. As illustrated in FIG. 6A, the connecting electrode pattern 103a includes an edge connecting-electrode 103ae close to the first electrode pattern 103, and a side surface of the first filling layer 104a is in contact with a side surface of the edge connecting-electrode 103ae and a side surface of the edge first-electrode 103e, respectively. The edge connecting-electrode 103ae is the connecting electrode 103a0 which is closest to the first electrode pattern 103.

Figure 6B:
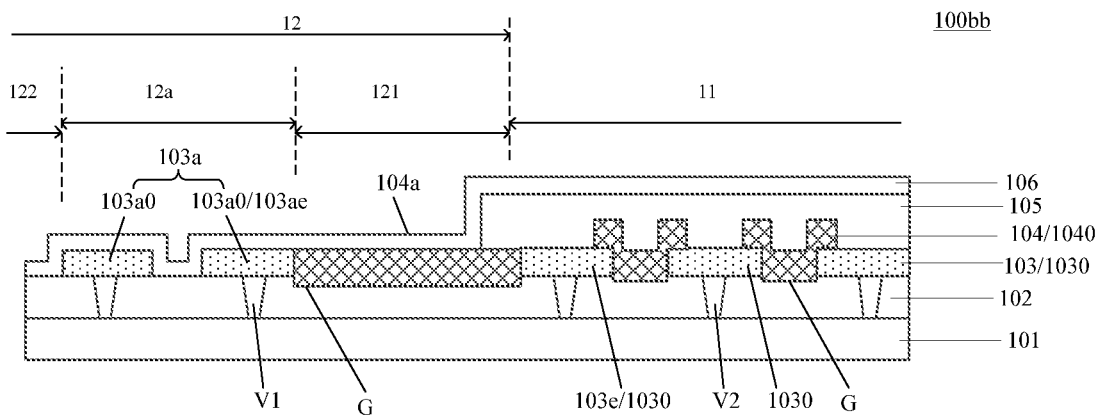
FIG. 6B is a schematic cross-sectional view of a display substrate provided by an embodiment of the present disclosure.

FIG. 6B is a cross-sectional view of a display substrate provided by an embodiment of the present disclosure. Compared with the display substrate 100b illustrated in FIG. 6A, the display substrate 100bb illustrated in FIG. 6B differs in that a groove G is disposed in the first insulation layer 102 of the display substrate 100bb. As illustrated in FIG. 6B, a size of the groove G in the first insulation layer 102, which is located between the edge first-electrode 103e and the connecting electrode 103a0 close to the edge first-electrode 103e, in the direction perpendicular to the base substrate 101 is greater than that of the groove G in the first insulation layer 102, which is located between adjacent first electrodes 1030, in the direction perpendicular to the base substrate 101. As illustrated in FIG. 6B, a portion of the first filling layer 104a is filled in the groove G between the edge first-electrode 103e and the connecting electrode pattern 103a.

Figure 7A:
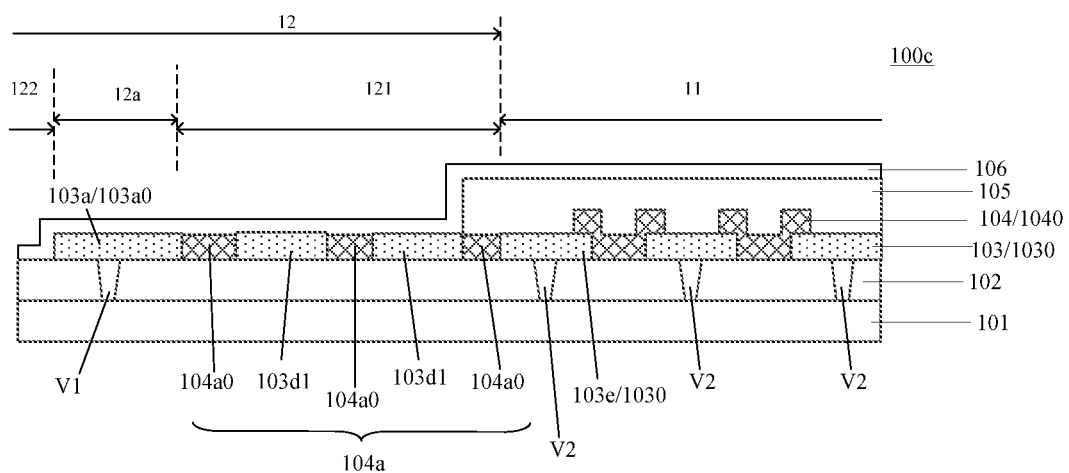
FIG. 7A is a schematic cross-sectional view of a display substrate provided by an embodiment of the present disclosure.

FIG. 7A is a schematic cross-sectional view of a display substrate provided by an embodiment of the present disclosure. As illustrated in FIG. 7A, Compared with the display substrate 100a, the display substrate 100c differs in that the first filling layer 104a includes at least one conductive filling portion 103d1 and at least one insulation filling portion 104a0, and the edge first-electrode 103e is in contact with the insulation filling portion 104a0. For example, the edge first-electrode 103e and the plurality of conductive filling portions 103d1 are insulated from each other. FIG. 7A illustrates three insulation filling portions 104a0 and two conductive filling portions 103d1. In the embodiments of the present disclosure, the number of the insulation filling portions 104a0 and the number of the conductive filling portions 103d1 are not limited to what are illustrated in the drawing, and can be determined as required. For example, a pattern density of the plurality of conductive filling portions 103d1 is the same as that of the first electrode pattern 103, without limited thereto.

As illustrated in FIG. 7A, in the display substrate provided by an embodiment of the present disclosure, the first filling layer 104a includes a plurality of conductive filling portions 103d1 and a plurality of insulation filling portions 104a0, and the plurality of conductive filling portions 103d1 and the plurality of insulation filling portions 104a0 are alternatively arranged. For example, the insulation filling portion 104a0 is located between adjacent conductive filling portions 103d1.

Figure 7B:
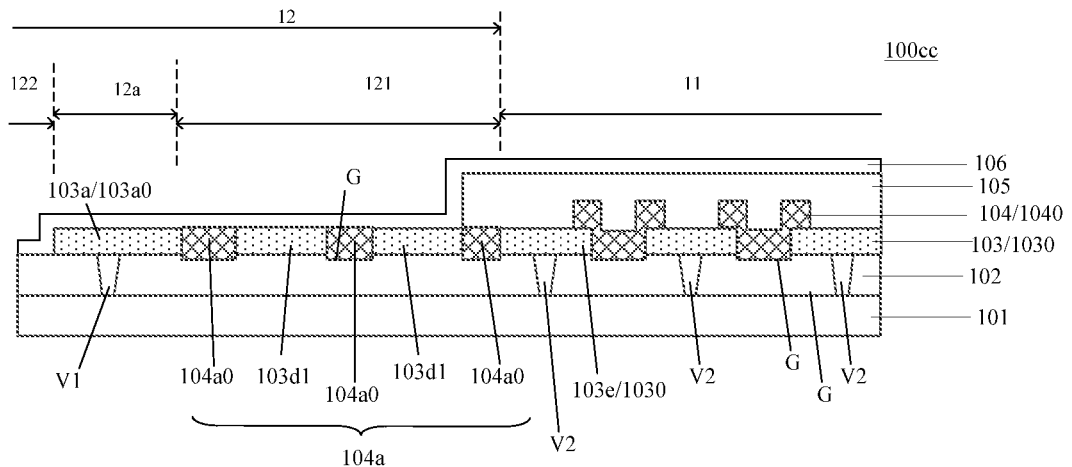
FIG. 7B is a schematic cross-sectional view of a display substrate provided by an embodiment of the present disclosure.

FIG. 7B is a cross-sectional view of a display substrate provided by an embodiment of the present disclosure. Compared with the display substrate 100c illustrated in FIG. 7A, the display substrate 100cc illustrated in FIG. 7B differs in that a groove G is disposed in the first insulation layer 102 of the display substrate 100cc. As illustrated in FIG. 7B, a size of the groove G in the first insulation layer 102, which is located between the edge first-electrode 103e and the connecting electrode 103a0 close to the edge first-electrode 103e, in the direction perpendicular to the base substrate 101 is equal to that of the groove G in the first insulation layer 102, which is located between adjacent first electrodes 1030, in the direction perpendicular to the base substrate 101, and a size of the groove G in the first insulation layer 102, which is located between adjacent connecting electrodes 103a0, in the direction perpendicular to the base substrate 101 is equal to that of the groove G in the first insulation layer 102, which is located between adjacent first electrodes 1030, in the direction perpendicular to the base substrate 101. As illustrated in FIG. 7B, a portion of the insulation filling portion 104a0 is filled in the groove G in the first insulation layer, which is located between adjacent connecting electrodes 103a0. As illustrated in FIG. 7B, a portion of the insulation filling portion 104a0 is filled in the groove G in the first insulation layer 102, which is located between the connecting electrode pattern 103a and the conductive filling portion 103d1. As illustrated in FIG. 7B, a portion of the insulation filling portion 104a0 is filled in the groove G in the first insulation layer 102, which is located between the edge first-electrode 103e and the conductive filling portion 103d1.

Figure 8A:
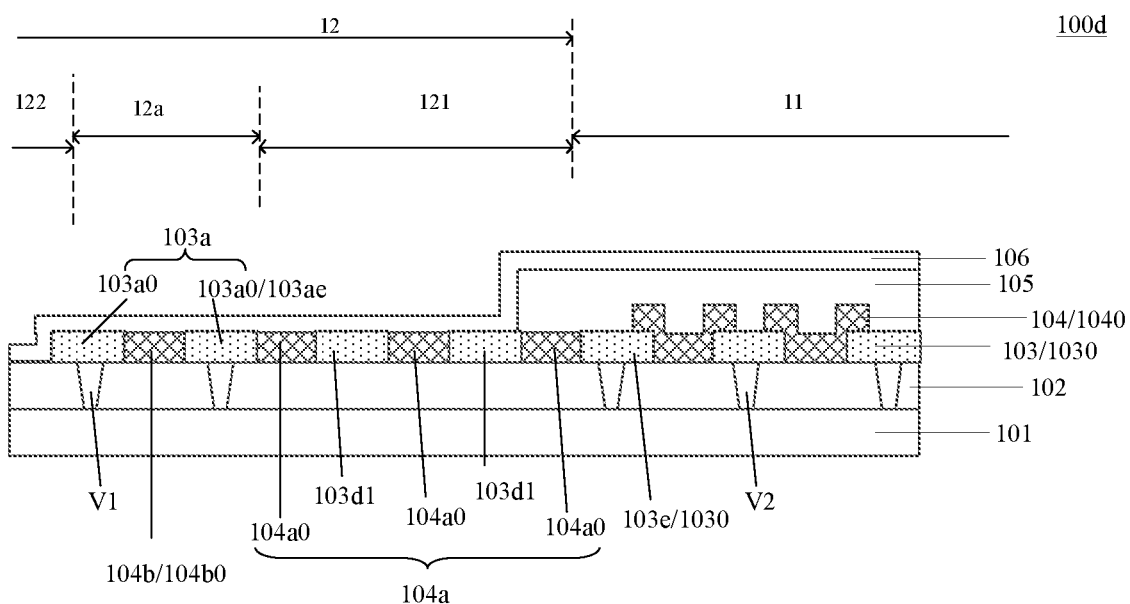
FIG. 8A is a schematic cross-sectional view of a display substrate provided by an embodiment of the present disclosure.

FIG. 8A is a schematic cross-sectional view of a display substrate provided by an embodiment of the present disclosure. As illustrated in FIG. 8A, Compared with the display substrate 100c, the display substrate 100d differs in that the connecting electrode pattern 103a includes a plurality of connecting electrodes 103a0, the display substrate 100d further includes a second filling layer 104b, the second filling layer 104b includes at least one second filling portion 104b0, and the second filling portion 104b0 is located between adjacent connecting electrodes 103a0. For example, the second filling portion 104b0 is in contact with the adjacent connecting electrodes 103a0, respectively. For example, a pattern density of the plurality of conductive filling portions 103d1, a pattern density of the first electrode pattern 103, and a pattern density of the plurality of connecting electrodes 103a0 are the same, without limited thereto.

Figure 8B:
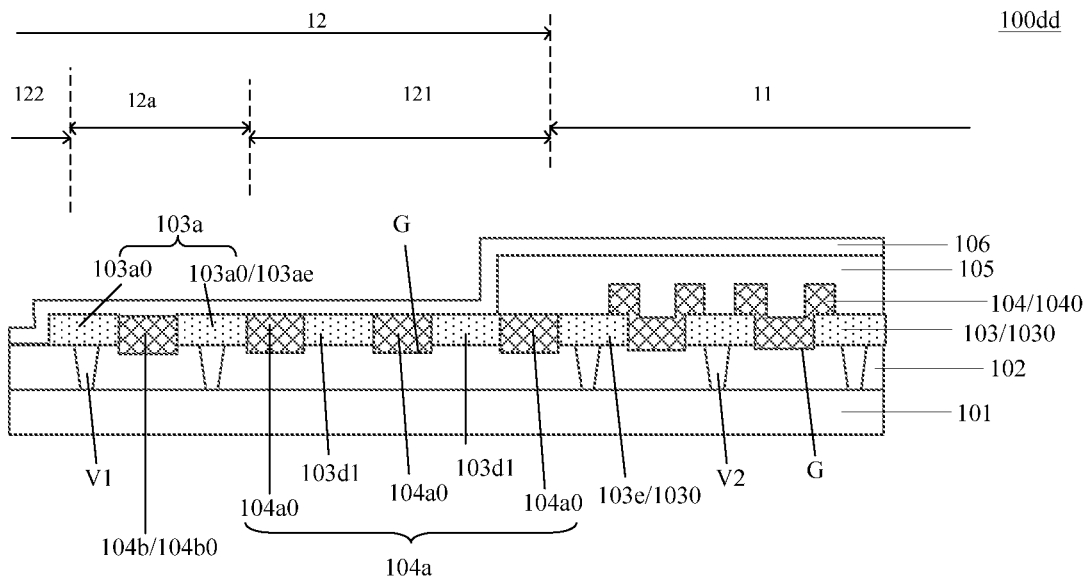
FIG. 8B is a cross-sectional view of a display substrate provided by an embodiment of the present disclosure.

FIG. 8B is a cross-sectional view of a display substrate provided by an embodiment of the present disclosure. Compared with the display substrate 100d illustrated in FIG. 8A, the display substrate 100dd illustrated in FIG. 8B differs in that a groove G is disposed in the first insulation layer 102 of the display substrate 100dd. As illustrated in FIG. 8B, the first insulation layer 102 includes a plurality of grooves G, and the plurality of grooves G have the same size in the direction perpendicular to the base substrate 101. All the grooves G in the first insulation layer 102 have the same size in the direction perpendicular to the base substrate 101. For example, the size of the groove G in the first insulation layer 102, which is located between the edge first-electrode 103e and the connecting electrode 103a0 close to the edge first-electrode 103e, in the direction perpendicular to the base substrate 101 is equal to that of the groove G in the first insulation layer 102, which is located between adjacent first electrodes 1030, in the direction perpendicular to the base substrate 101; the size of the groove G in the first insulation layer 102, which is located between adjacent conductive filling portions 103d1, in the direction perpendicular to the base substrate 101 is equal to that of the groove G in the first insulation layer 102, which is located between adjacent first electrodes 1030, in the direction perpendicular to the base substrate 101; and the size of the groove G in the first insulation layer 102, which is located between adjacent first connecting electrodes 103a0, in the direction perpendicular to the base substrate 101 is equal to that of the groove G in the first insulation layer 102, which is located between adjacent first electrodes 1030, in the direction perpendicular to the base substrate 101.

As illustrated in FIG. 8A, in the display substrate provided by an embodiment of the present disclosure, the second filling layer 104b is an insulation layer. For example, the second filling layer 104b and the first filling layer 104a are located in the same layer, and can be formed of the same film layer by the same patterning process so as to save a manufacturing process.

For example, as illustrated in FIG. 8A, a pattern density of the first electrode pattern 103, a pattern density of the plurality of conductive filling portions 103d1 and a pattern density of the connecting electrode pattern 103a are all the same, so that etching evenness can be improved, thereby improving connection reliability between the second electrode 106 and the connecting electrode pattern 103a and improving performance of the display substrate.

As illustrated in FIG. 5A to FIG. 8A, in the display substrate provided by the embodiments of the present disclosure, the display substrate further includes a light-emitting functional layer 105, the light-emitting functional layer 105 is located between the first electrode pattern 103 and the second electrode 106, and the light-emitting functional layer 105 and the first filling layer 104a are different layers. For example, the light-emitting functional layer 105 is in contact with the first filling layer 104a. For example, the first electrode pattern 103 and the second electrode 106 are spaced apart from each other by the first filling layer 104a and the light-emitting functional layer 105.

As illustrated in FIG. 5A to FIG. 8A, in the display substrate provided by an embodiment of the present disclosure, the light-emitting functional layer 105 is in contact with a part of the first filling layer 104a.

As illustrated in FIG. 5A to FIG. 8A, in the display substrate provided by an embodiment of the present disclosure, the display substrate further includes a pixel defining layer 104, and the pixel defining layer 104 includes a plurality of pixel defining portions 1040; and each of the plurality of pixel defining portions 1040 is located between adjacent first electrodes 1030. For example, the plurality of first electrodes 1030 are spaced apart from each other. For example, the plurality of first electrodes 1030 are spaced apart from each other in the direction parallel with the base substrate 101. For example, the plurality of first electrodes 1030 are independent of each other, and are separated from each other.

As illustrated in FIG. 5A to FIG. 8A, in the display substrate provided by an embodiment of the present disclosure, the first electrode pattern 103 and the connecting electrode pattern 103a are located in the same layer, and can be formed of the same film layer by the same patterning process so as to save a manufacturing process.

As illustrated in FIG. 5A to FIG. 8A, the display substrate further includes the base substrate 101, and the first insulation layer 102 located on the base substrate 101. The first insulation layer 102 includes a first via hole V1 and a second via hole V2. The first via hole V1 and the second via hole V2 are filled with a conductive material so as to form connecting elements, respectively, and the conductive material includes metal, e.g., tungsten, without limited thereto. The connecting electrode pattern 103a and the first electrode pattern 103 which are located in the same layer are arranged on the first insulation layer 102. The first electrode pattern 103 includes a plurality of first electrodes 1030. The first electrode 1030 is connected with an element below, e.g., the drain electrode (not illustrated) of the thin film transistor, by the connecting element in the second via hole V2, and the connecting electrode 103a0 or the connecting electrode pattern 103a is connected with a connecting line (not illustrated) below by the connecting element in the first via hole V1. As illustrated in FIG. 5B, FIG. 6B, FIG. 7B and FIG. 8B, the first electrode pattern 103 and the connecting electrode pattern 103a are located at a side of the first insulation layer 102 away from the base substrate 101, and are in contact with the first insulation layer 102, respectively; a portion of the first insulation layer 102, which is located between the first electrode pattern 103 and the connecting electrode pattern 103a, has the groove, and the first filling layer 104a is at least partially located in the groove G.

As illustrated in FIG. 5A to FIG. 8A, the connecting electrode pattern 103a and the first electrode pattern 103 are in contact with the first insulation layer 102, respectively.

As illustrated in FIG. 5A to FIG. 8A, the peripheral region 12 includes a first dummy region 121 and a second dummy region 122. The first dummy region 121 is located between a connecting electrode region 12a and the display region 11, and the second dummy region 122 is located at a side of the connecting electrode region 12a away from the display region 11.

As illustrated in FIG. 5A to FIG. 8A, an orthographic projection of the first filling layer 104a on the base substrate 101 partially overlaps with an orthographic projection of the light-emitting functional layer 105 on the base substrate 101.

For example, as illustrated in FIG. 5A and FIG. 6A, the first filling layer 104a and the pixel defining layer 104 are located in the same layer, and can be formed of the same film layer by the same patterning process so as to save a manufacturing process.

As illustrated in FIG. 7A, in the display substrate provided by an embodiment of the present disclosure, the at least one insulation filling portion 104a0 and the pixel defining layer 104 are located in the same layer, and can be formed of the same film layer by the same patterning process so as to save a manufacturing process.

As illustrated in FIG. 7A and FIG. 8A, in the display substrate provided by an embodiment of the present disclosure, the first electrode pattern 103, the at least one conductive filling portion 103d1 and the connecting electrode pattern 103a are located in the same layer, and can be formed of the same film layer by the same patterning process so as to save a manufacturing process.

For example, as illustrated in FIG. 8A, the second filling layer 104b, the first filling layer 104a and the pixel defining layer 104 are located in the same layer, and can be formed of the same film layer by the same patterning process so as to save a manufacturing process.

As illustrated in FIG. 7A to FIG. 8A, the plurality of conductive filling portions 103d1, the connecting electrode pattern 103a and the first electrode pattern 103 are in contact with the first insulation layer 102, respectively.

As illustrated in FIG. 7A to FIG. 8A, the via hole is not provided in a portion of the first insulation layer 102, which is located right below the conductive filling portion 103d1. The first via hole V1 is disposed in a portion of the first insulation layer 102, which is located right below the connecting electrode 103a0. The second via hole V2 is disposed in a portion of the first insulation layer 102, which is located right below the first electrode 1030.

For example, the first electrode in the first electrode pattern may be an anode of a light-emitting element, and the second electrode may be a cathode of the light-emitting element. The connecting electrode is connected with the second electrode and is spaced apart from the first electrode. Namely, two electrodes of the light-emitting element may be the first electrode and the second electrode, respectively. The connecting electrode may be of a ring shape, and in this case, the connecting electrode may be called as a cathode ring. The light-emitting element may include a light-emitting functional layer. The light-emitting functional layer includes a light-emitting layer, the light-emitting functional layer may further include at least one selected from the group consisting of a hole transport layer, a hole injection layer, an electron transport layer and an electron injection layer, and an organic electroluminescent element can emit light under the electrical drive of the first electrode and the second electrode. The light-emitting element, for example, includes an OLED, without limited thereto.

Figure 9:
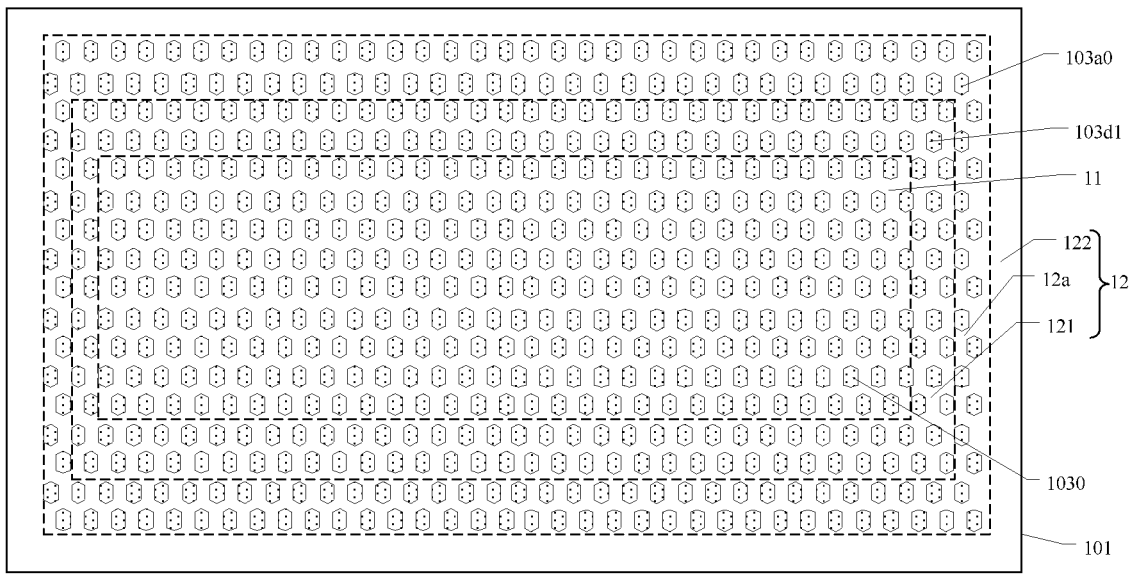
FIG. 9 is a top view of a first electrode pattern, a connecting electrode pattern and a conductive filling portion in a display substrate provided by an embodiment of the present disclosure.

FIG. 9 is a top view of a first electrode pattern, a connecting electrode pattern and a conductive filling portion in a display substrate provided by an embodiment of the present disclosure. As illustrated in FIG. 9, a pattern density of the first electrode pattern 103, a pattern density of the connecting electrode pattern 103 and a pattern density of the plurality of conductive filling portions 103d1 can be the same. FIG. 9 illustrates the connecting electrode 103a0, the conductive filling portion 103d1 and the first electrode 1030. For example, as illustrated in FIG. 9, a shape of the first electrode 1030, a shape of the connecting electrode 103a0, and a shape of the conductive filling portion 103d1 can be the same, without limited thereto. For example, in FIG. 9, each connecting electrode 103a0 located in the connecting electrode region 12a is externally connected. Namely, each connecting electrode 103a0 is connected with the connecting element in the via hole right below the connecting electrode 103a0. Each connecting electrode 103a0 is connected with the connecting element in the via hole in the first insulation layer in contact with the connecting electrode 103a0. For example, a portion in the insulation layer in contact with each conductive filling portion 103d1, which is located below the conductive filling portion 103d1, does not have the via hole at a position corresponding to the conductive filling portion 103d1. For example, the connecting electrode pattern 103a is of a ring shape.

Figure 10:
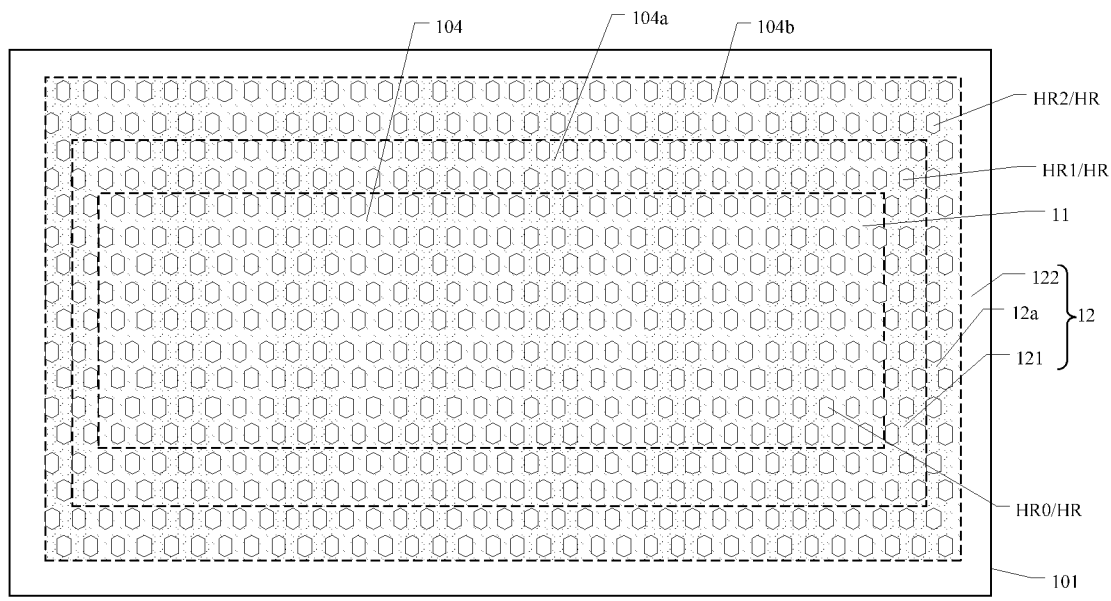
FIG. 10 is a top view of a first filling layer, a second filling layer and a pixel defining layer in a display substrate provided by an embodiment of the present disclosure.

FIG. 10 is a top view of a first filling layer, a second filling layer and a pixel defining layer in a display substrate provided by an embodiment of the present disclosure. FIG. 10 illustrates the first filling layer 104a, the second filling layer 104b and the pixel defining layer 104. As illustrated in FIG. 10, a patterned structure of a pixel defining thin film includes a plurality of hollow regions HR. The pixel defining thin film can cover the base substrate 101 in an entire surface mode. The plurality of hollow regions HR include a hollow region HR0 located in the display region 11, a hollow region HR1 located in the first dummy region 121 and a hollow region HR2 located in the connecting electrode region 12a. The hollow region HR0 is configured to expose the first electrode 1030, the hollow region HR1 is configured to expose the conductive filling portion 103d1, and the hollow region HR2 is configured to expose the connecting electrode 103a0.

The top views illustrated in FIG. 9 and FIG. 10 can correspond to a display panel illustrated in FIG. 8A, without limited thereto. A second dummy electrode pattern can also be arranged in the second dummy region 121 in FIG. 9 and FIG. 10, the second dummy electrode pattern may include a plurality of second dummy electrodes, and a pattern density of the second dummy electrode pattern can be the same as that of the first electrode pattern.

At least one embodiment of the present disclosure further provides a display device, including any one display substrate in the first aspect. The display device, for example, includes a micro OLED display device, without limited thereto.

At least one embodiment of the present disclosure further provides a manufacturing method of a display substrate, which includes: forming a first insulation layer on a base substrate; forming a first electrode pattern 103, the first electrode pattern 103 being located in a display region 11, the first electrode pattern 103 including a plurality of first electrodes 1030 spaced apart from each other, and the first electrode 1030 being configured to receive a pixel driving signal; forming a connecting electrode pattern 103a, the connecting electrode pattern 103a being located in a peripheral region 12 (in a connecting electrode region 12a in the peripheral region 12), and the connecting electrode pattern 103a surrounding the first electrode pattern 103; forming a second electrode 106, the second electrode 106 being located in the display region 11 and the peripheral region 12, the second electrode 106 being connected with the connecting electrode pattern 103a, the second electrode 106 and the first electrode pattern 103 being spaced apart from each other, and the second electrode being configured to receive a first power signal; forming a light-emitting functional layer 105, the light-emitting functional layer 105 being located between the first electrode pattern 103 and the second electrode 106; and forming a first filling layer 104a, the first filling layer 104a being located between the connecting electrode pattern 103a and the first electrode pattern 103. The first filling layer 104a and the light-emitting functional layer 105 are different layers, the first electrode pattern and the connecting electrode pattern are located at a side of the first insulation layer away from the base substrate, and are in contact with the first insulation layer, respectively; a portion of the first insulation layer, which is located between the first electrode pattern and the connecting electrode pattern, has a groove, and the first filling layer is at least partially located in the groove.

In a manufacturing method of a display substrate, as provided by an embodiment of the present disclosure, the first electrode pattern includes an edge first-electrode close to the connecting electrode pattern, and the first filling layer is in contact with the connecting electrode pattern and the edge first-electrode, respectively.

In a manufacturing method of a display substrate, as provided by an embodiment of the present disclosure, the second electrode is in contact with the first filling layer.

A manufacturing method of a display substrate, as provided by an embodiment of the present disclosure, further includes: forming a pixel defining layer, the pixel defining layer includes a plurality of pixel defining portions, and the first electrode pattern includes a plurality of first electrodes spaced apart from each other, and the pixel defining portion is located between adjacent first electrodes.

In a manufacturing method of a display substrate, as provided by an embodiment of the present disclosure, the pixel defining layer and the first filling layer are formed by the same patterning process, and the first electrode pattern and the connecting electrode pattern are formed by the same patterning process.

In a manufacturing method of a display substrate, as provided by an embodiment of the present disclosure, forming the first filling layer includes: forming at least one conductive filling portion and forming at least one insulation filling portion; the first electrode pattern, the connecting electrode pattern and the at least one conductive filling portion are formed by the same patterning process; and the pixel defining layer and the at least one insulation filling portion are formed by the same patterning process.

A manufacturing method of a display substrate, as provided by an embodiment of the present disclosure, further includes: forming a second filling layer, the second filling layer includes at least one second filling portion, the connecting electrode pattern includes a plurality of connecting electrodes, and the second filling portion is located between adjacent connecting electrodes; and the second filling layer is formed in the same patterning process for forming the pixel defining layer and the at least one insulation filling portion.

In a manufacturing method of a display substrate, as provided by an embodiment of the present disclosure, forming the first filling layer 104a includes: forming at least one conductive filling portion 103d1 and forming at least one insulation filling portion 104a0; the edge first-electrode 103e is in contact with the insulation filling portion 104a0; and the edge first-electrode 103e and the conductive filling portion 103d1 are insulated from each other. The edge first-electrode 103e is close to the connecting electrode pattern 103a. For example, the edge first-electrode 103e is the first electrode 1030 which is closest to the connecting electrode pattern 103a.

In a manufacturing method of a display substrate, as provided by an embodiment of the present disclosure, forming the first filling layer 104a includes: forming at least one conductive filling portion 103d1 and forming at least one insulation filling portion 104a0.

In a manufacturing method of a display substrate, as provided by an embodiment of the present disclosure, forming the first filling layer 104a includes: forming a plurality of conductive filling portion 103d1 and forming a plurality of insulation filling portion 104a0, and the plurality of conductive filling portion 103d1 and the plurality of insulation filling portion 104a0 are alternatively arranged.

In a manufacturing method of a display substrate, as provided by an embodiment of the present disclosure, the manufacturing method further includes: forming a pixel defining layer 104; forming the pixel defining layer 104 includes: forming a plurality of pixel defining portions 1040; the first electrode pattern 103 includes a plurality of first electrodes 1030 spaced apart from each other; and each of the plurality of pixel defining portions 1040 is located between adjacent first electrodes 1030.

In a manufacturing method of a display substrate, as provided by an embodiment of the present disclosure, the first filling layer 104a or at least one insulation filling portion 104a0 is formed of the same film layer by the same patterning process as the pixel defining layer 104.

In a manufacturing method of a display substrate, as provided by an embodiment of the present disclosure, the first electrode pattern 103 and the connecting electrode pattern 103a are formed of the same film layer by the same patterning process.

In a manufacturing method of a display substrate, as provided by an embodiment of the present disclosure, the manufacturing method further includes: forming a second filling layer 104b; forming the second filling layer 104b includes: forming at least one second filling portion 104b0;

the connecting electrode pattern 103a includes a plurality of connecting electrode 103a0; and the second filling portion 104b0 is located between adjacent connecting electrodes 103a0.

In a manufacturing method of a display substrate, as provided by an embodiment of the present disclosure, the second filling portion 104b0 is in contact with the adjacent connecting electrodes 103a0, respectively.

In a manufacturing method of a display substrate, as provided by an embodiment of the present disclosure, the second filling layer 104b is an insulation layer.

In a manufacturing method of a display substrate, as provided by an embodiment of the present disclosure, the second filling layer 104b and the first filling layer 104a are formed of the same film layer by the same patterning process.

In a manufacturing method of a display substrate, as provided by an embodiment of the present disclosure, the light-emitting functional layer 105 is in contact with the first filling layer 104a.

In a manufacturing method of a display substrate, as provided by an embodiment of the present disclosure, the light-emitting functional layer 105 is in contact with a part of the first filling layer 104a.

A manufacturing method of a display substrate, as provided by an embodiment of the present disclosure, includes: forming a first electrode pattern 103 located in a display region 11 of the display substrate; forming a connecting electrode pattern 103a located in a peripheral region 12 of the display substrate, the peripheral region 12 surrounding the display region 11; forming a second electrode 106, the second electrode 106 being connected with the connecting electrode pattern 103a, the second electrode 106 being located in the display region 11 and the peripheral region 12, and the second electrode 106 and the first electrode pattern 103 being spaced apart from each other; forming the light-emitting functional layer 105, the light-emitting functional layer 105 being located between the first electrode pattern 103 and the second electrode 106; and forming the first filling layer 104a, the first filling layer 104a being located between the connecting electrode pattern 103a and the first electrode pattern 103. Any one display substrate illustrated in FIG. 5A to FIG. 8A can be formed by using this method.

A manufacturing method of a display substrate, as provided by an embodiment of the present disclosure, includes: forming a first insulation layer on a base substrate; forming a conductive thin film on the first insulation layer, and performing a single patterning process on the conductive thin film so as to simultaneously form a first electrode pattern 103 and a connecting electrode pattern 103a; forming a pixel defining thin film on the first electrode pattern 103 and the connecting electrode pattern 103a, and performing a single patterning process on the pixel defining thin film so as to simultaneously form the first filling layer 104a and the pixel defining layer 104; forming a light-emitting functional layer 105 on the first filling layer 104a and the pixel defining layer 104; and forming the second electrode 106 on the light-emitting functional layer 105. Any one display substrate illustrated in FIG. 5A to FIG. 8A can be formed by using this method.

A manufacturing method of a display substrate, as provided by an embodiment of the present disclosure, includes: forming an insulation thin film on a base substrate 101, and patterning the insulation thin film to form a first via hole V1 and a second via hole V2 so as to form the first insulation layer 102; filling a conductive material in the first via hole V1 and the second via hole V2 to form connecting elements, respectively; forming a conductive thin film on the first insulation layer 102 and the connecting element, and performing a single patterning process on the conductive thin film so as to simultaneously form the first electrode pattern 103 and the connecting electrode pattern 103a; forming the pixel defining thin film on the first electrode pattern 103 and the connecting electrode pattern 103a, and performing a single patterning process on the pixel defining thin film so as to simultaneously form the first insulation layer 104a and the pixel defining layer 104; forming the light-emitting functional layer 105 on the first filling layer 104a and the pixel defining layer 104; and forming the second electrode 106 on the light-emitting functional layer 105. Any one display substrate illustrated in FIG. 5A to FIG. 8A can be formed by using this method.

A manufacturing method of a display substrate, as provided by an embodiment of the present disclosure, includes: forming an insulation thin film on a base substrate 101, and patterning the insulation thin film to form a first via hole V1 and a second via hole V2 so as to form a first insulation layer 102; filling a conductive material in the first via hole V1 and the second via hole V2 to form connecting elements, respectively; forming a conductive thin film on the first insulation layer 102 and the connecting elements, and performing a single patterning process on the conductive thin film so as to simultaneously form a first electrode pattern 103, a connecting electrode pattern 103a and at least one conductive filling portion 103d1; forming a pixel defining thin film on the first electrode pattern 103, the connecting electrode pattern 103a and the at least one conductive filling portion 103d1, and performing a single patterning process on the pixel defining thin film so as to simultaneously form a pixel defining layer 104 and at least one insulation filling portion 104a0; forming a light-emitting functional layer 105 on the pixel defining layer 104 and the at least one insulation filling portion 104a0; and forming a second electrode 106 on the light-emitting functional layer 105. The display substrate illustrated in FIG. 7A can be formed by using this method.

A manufacturing method of a display substrate, as provided by an embodiment of the present disclosure, includes: forming an insulation thin film on a base substrate 101, and patterning the insulation thin film to form a first via hole V1 and a second via hole V2 so as to form a first insulation layer 102; filling a conductive material in the first via hole V1 and the second via hole V2 to form the connecting elements, respectively; forming a conductive thin film on the first insulation layer 102 and the connecting elements, and performing a single patterning process on the conductive thin film so as to simultaneously form a first electrode pattern 103, a connecting electrode pattern 103a and at least one conductive filling portion 103d1, the connecting electrode pattern 103a including a plurality of connecting electrodes 103a0; forming a pixel defining thin film on the first electrode pattern 103, the connecting electrode pattern 103a and the at least one conductive filling portion 103d1, and performing a single patterning process on the pixel defining thin film so as to simultaneously form a pixel defining layer 104, at least one insulation filling portion 104a0 and the second filling layer 104b; forming a light-emitting functional layer 105 on the pixel defining layer 104 and the at least one insulation filling portion 104a0; and forming a second electrode 106 on the light-emitting functional layer 105. The display substrate illustrated in FIG. 8A can be formed by using this method.

For example, the display substrate in the first aspect can be formed by using the manufacturing method above, the display substrate can be any one of the display substrates above, and the specific description on the display substrate can refer to the above, without repeated herein.

In a second aspect, in order to reduce the height fall of the second electrode 106 and/or improve etching evenness, embodiments of the present disclosure provide a display substrate and a manufacturing method thereof, and a display device.

Figure 11:
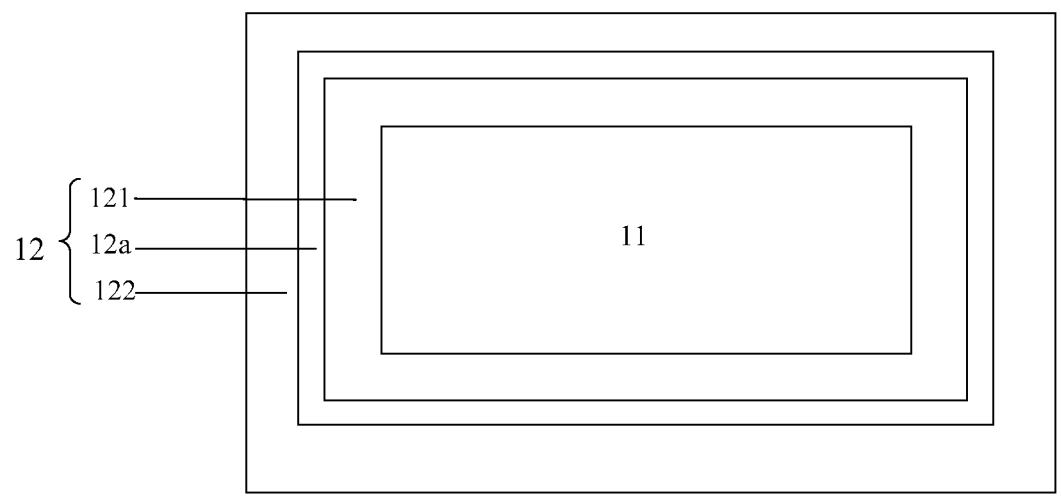
FIG. 11 is a schematic diagram of region partitioning of a display substrate provided by an embodiment of the present disclosure.

FIG. 11 is a schematic diagram of region partitioning of a display substrate provided by an embodiment of the present disclosure. As illustrated in FIG. 11, a display substrate includes a display region 11 and a peripheral region 12, and the peripheral region 12 includes a connecting electrode region 12a, so that the peripheral region 12 includes three regions: the connecting electrode region 12a, a first dummy region 121 and a second dummy region 122. The first dummy region 121 is located between the connecting electrode region 12a and the display region 11, and the second dummy region 122 is located at a side of the connecting electrode region 12a away from the display region 11. As illustrated in FIG. 11, the second dummy region 122 is located at a side of the connecting electrode region 12a away from the first dummy region 121. The first dummy region 121 is provided to avoid the short circuit of elements in the display region and the connecting electrode region 12a, which need to be insulated from each other, and the second dummy region 122 is provided to facilitate encapsulation the display substrate and improving the encapsulation effect.

Figure 12:
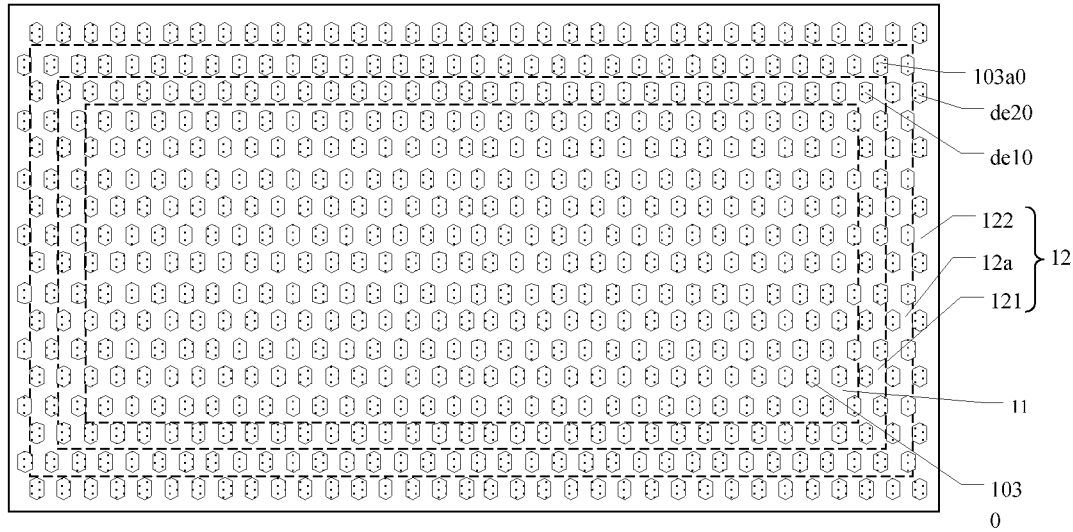
FIG. 12 is a schematic top view of a display substrate provided by an embodiment of the present disclosure.

FIG. 12 is a schematic top view of a display substrate provided by an embodiment of the present disclosure. FIG. 12 illustrates a top view of a structure formed after a conductive thin film is subjected to a single patterning process. FIG. 12 illustrates the display region 11, the peripheral region 12, the connecting electrode region 12a, the first dummy region 121 and the second dummy region 122. FIG. 12 further illustrates a first electrode 1030, a first dummy electrode de10, a second dummy electrode de20 and a connecting electrode 103a0. The first electrode 1030 is located in the display region 11, the first dummy electrode de10 is located in the first dummy region 121, the second dummy electrode de20 is located in the second dummy region 122, and the connecting electrode 103a0 is located in the connecting electrode region 12a. For example, a connecting electrode pattern 103a is of a ring shape.

For example, as illustrated in FIG. 12, in order to improve etching evenness, the first dummy electrode de10 is of a block shape. For example, as illustrated in FIG. 12, in order to improve etching evenness, the second dummy electrode de20 is of a block shape. As illustrated in FIG. 12, in order to improve etching evenness, the connecting electrode 103a0 is of a block shape. For example, as illustrated in FIG. 12, the first electrode 1030 is of a block shape. For example, the block shape includes a polygon, without limited thereto. For example, as illustrated in FIG. 12, the shapes of the first electrode 1030, the first dummy electrode de10, the second dummy electrode de20 and the connecting electrode 103a0 are the same, without limited thereto.

Figure 13A:
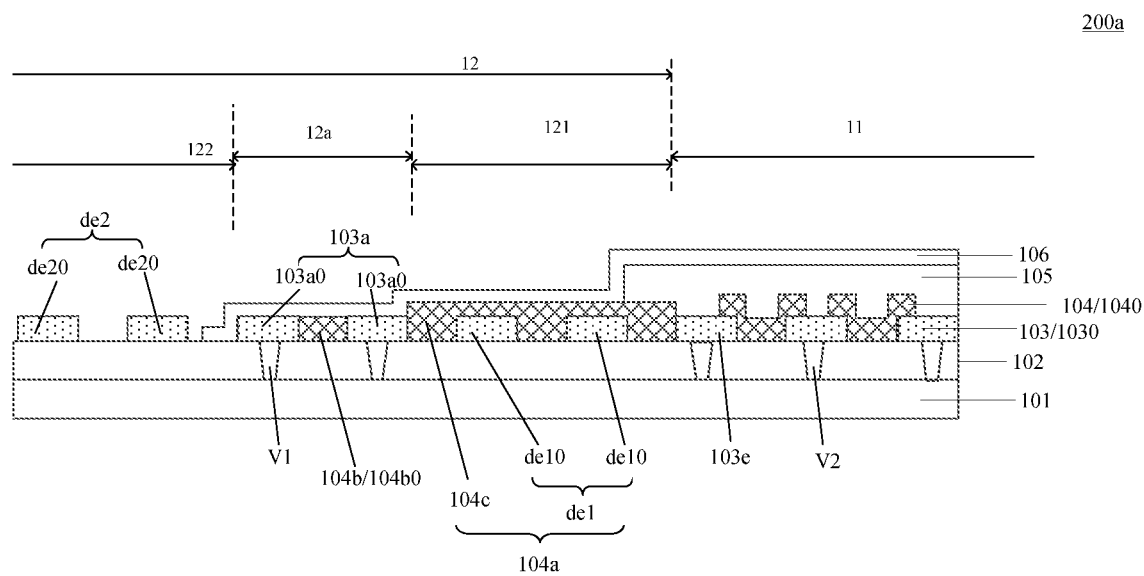
FIG. 13A is a schematic cross-sectional view of a display substrate provided by an embodiment of the present disclosure.

FIG. 13A is a schematic cross-sectional view of a display substrate provided by an embodiment of the present disclosure. As illustrated in FIG. 13A, a display substrate 200a includes: a first electrode pattern 103, which is located in the display region 11 of the display substrate and includes a plurality of first electrodes 1030 spaced apart from each other, the first electrode being configured to receive a pixel driving signal; and the connecting electrode pattern 103a, which is located in the connecting electrode region 12a of the display substrate and includes a plurality of connecting electrodes 103a0. The connecting electrode region 12a surrounds the display region 11. For example, as illustrated in FIG. 12 and FIG. 13A, the plurality of connecting electrodes 103a0 surround the plurality of first electrodes 1030.

As illustrated in FIG. 12 and FIG. 13A, in the display substrate provided by an embodiment of the present disclosure, the display substrate further includes a second electrode 106, the second electrode 106 is connected with the plurality of connecting electrodes 103a0; the peripheral region 12 surrounds the display region 11, and the peripheral region 12 includes the connecting electrode region 12a and the first dummy region 121; and the second electrode 106 is located in the display region 11 and the peripheral region 12, and the second electrode 106 and the first electrode pattern 103 are spaced apart from each other. The second electrode is configured to receive a first power signal.

As illustrated in FIG. 12 and FIG. 13A, in order to improve etching evenness, a pattern density of the connecting electrode pattern 103a is the same as that of the first electrode pattern 103.

As illustrated in FIG. 12 and FIG. 13A, in the display substrate provided by an embodiment of the present disclosure, the display substrate 200a further includes a first dummy electrode pattern de1, and the first dummy electrode pattern de1 is located in the first dummy region 121 and includes a plurality of first dummy electrodes de10. The first dummy region 121 is located between the connecting electrode region 12a and the display region 11, and in order to improve etching evenness, a pattern density of the first dummy electrode pattern de1 is the same as that of the first electrode pattern 103.

As illustrated in FIG. 12 and FIG. 13A, in the display substrate provided by an embodiment of the present disclosure, the display substrate further includes a second dummy electrode pattern de2 which is located in the second dummy region 122 and includes a plurality of second dummy electrodes de20; and the second dummy region 122 is located at a side of the connecting electrode region 12a away from the display region 11. In order to improve etching evenness, a pattern density of the second dummy electrode pattern de2 is the same as that of the first electrode pattern 103.

As illustrated in FIG. 13A, in the display substrate provided by an embodiment of the present disclosure, a first filling layer 104a is arranged in the first dummy region 121, the first filling layer 104a includes a plurality of first dummy electrodes de10 and an insulation filling layer 104c, the first electrode pattern 103 includes an edge first-electrode 103e close to the connecting electrode 103a0, and the insulation filling layer 104c is in contact with the connecting electrode 103a0 and the edge first-electrode 103e, respectively. For example, the edge first-electrode 103e is the first electrode 1030 which is closest to the connecting electrode 103a0.

As illustrated in FIG. 13A, in the display substrate provided by an embodiment of the present disclosure, the second electrode 106 is in contact with the insulation filling layer 104c.

As illustrated in FIG. 13A, in the display substrate provided by an embodiment of the present disclosure, the edge first-electrode 103e and the plurality of first dummy electrodes de10 are insulated from each other.

In the display substrate provided by an embodiment of the present disclosure, the display substrate further includes a pixel defining layer 104, and the pixel defining layer 104 includes a plurality of pixel defining portions 1040. For example, each of the plurality of pixel defining portions 1040 is located between adjacent first electrodes 1030.

As illustrated in FIG. 13A, in the display substrate provided by an embodiment of the present disclosure, the insulation filling layer 104c and the pixel defining layer 104 are located in the same layer, and can be formed of the same film layer by the same patterning process so as to save a manufacturing process.

As illustrated in FIG. 13A, in the display substrate provided by an embodiment of the present disclosure, the first electrode pattern 103 and the connecting electrode pattern 103a are located in the same layer, and can be formed of the same film layer by the same patterning process so as to save a manufacturing process.

As illustrated in FIG. 13A, in the display substrate provided by an embodiment of the present disclosure, the display substrate further includes a second filling layer 104b, the second filling layer 104b includes at least one second filling portion 104b0, and the second filling portion 104b0 is located between adjacent connecting electrodes 103a0. As illustrated in FIG. 13A, in the display substrate provided by an embodiment of the present disclosure, the second filling portion 104b0 is in contact with the adjacent connecting electrodes 103a0, respectively.

As illustrated in FIG. 13A, in the display substrate provided by an embodiment of the present disclosure, the second filling layer 104b is an insulation layer. For example, the second filling layer 104b and the insulation filling layer 104c are located in the same layer, and can be formed of the same film layer by the same patterning process so as to save a manufacturing process.

As illustrated in FIG. 13A, in the display substrate provided by an embodiment of the present disclosure, the display substrate further includes a light-emitting functional layer 105, the light-emitting functional layer 105 is located between the first electrode pattern 103 and the second electrode 106, and the light-emitting functional layer 105 is in contact with the insulation filling layer 104c. For further example, the light-emitting functional layer 105 is in contact with the insulation filling layer 104c.

As illustrated in FIG. 13A, in the display substrate provided by an embodiment of the present disclosure, the light-emitting functional layer 105 is in contact with a part of the insulation filling layer 104c.

As illustrated in FIG. 13A, in the display substrate provided by an embodiment of the present disclosure, the first dummy electrode de10 is not externally connected, and a via hole is not provided in a portion of the first insulation layer below, which is in contact with the first dummy electrode de10 and located right below the first dummy electrode de10, which can refer to the description on the first dummy electrode 103d1. A first via hole V1 and a second via hole V2 can refer to the previous description, without repeated herein.

In the embodiments of the present disclosure, FIG. 13A is illustrated with reference to the case where the insulation filling layer 104c completely covers the plurality of first dummy electrodes de10, by way of example, without limited thereto in the embodiments of the present disclosure.

Figure 13B:
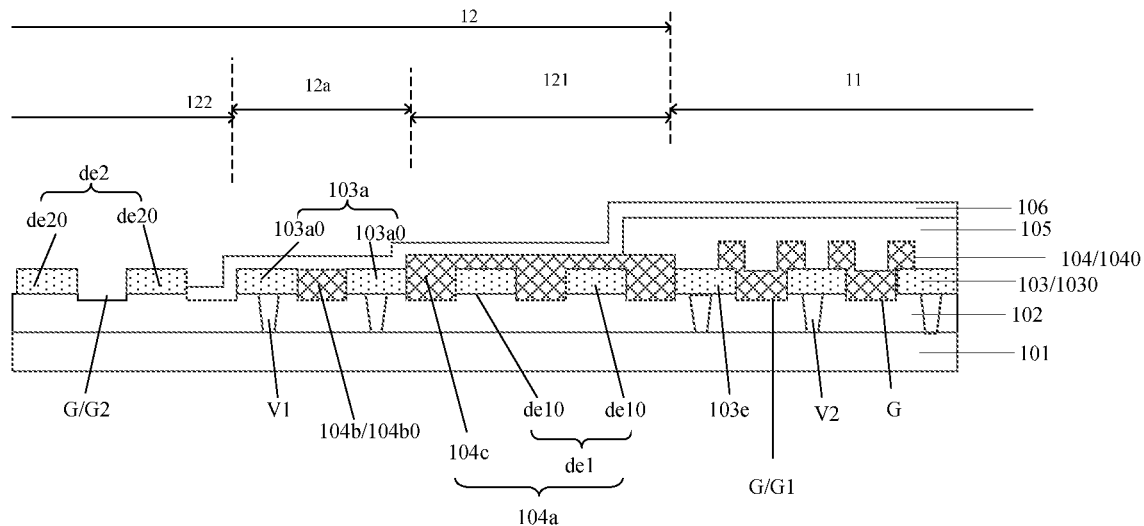
FIG. 13B is a schematic cross-sectional view of a display substrate provided by an embodiment of the present disclosure.

FIG. 13B is a cross-sectional view of a display substrate provided by an embodiment of the present disclosure. Compared with the display substrate 200a illustrated in FIG. 13A, the display substrate 200aa illustrated in FIG. 13B differs in that a groove G is disposed in the first insulation layer 102 of the display substrate 200aa. As illustrated in FIG. 13B, a size of the groove G in the first insulation layer 102, which is located in the display region 11, in a direction perpendicular to a base substrate 101 is equal to that of the groove G in the first insulation layer 102, which is located in the peripheral region 12, in the direction perpendicular to the base substrate 101. For example, the sizes of all the grooves G in the first insulation layer 102 in the direction perpendicular to the base substrate 101 are all equal. As illustrated in FIG. 13B, the sizes of the groove G in the first insulation layer 102, which is located in the second dummy region 122, the groove G in the first insulation layer 102, which is located in the connecting electrode region 12a, the groove G in the first insulation layer 102, which is located in the first dummy region 121, and the groove G in the first insulation layer 102, which is located in the display region 11, in the direction perpendicular to the base substrate 101 are all equal.

Figure 14A:
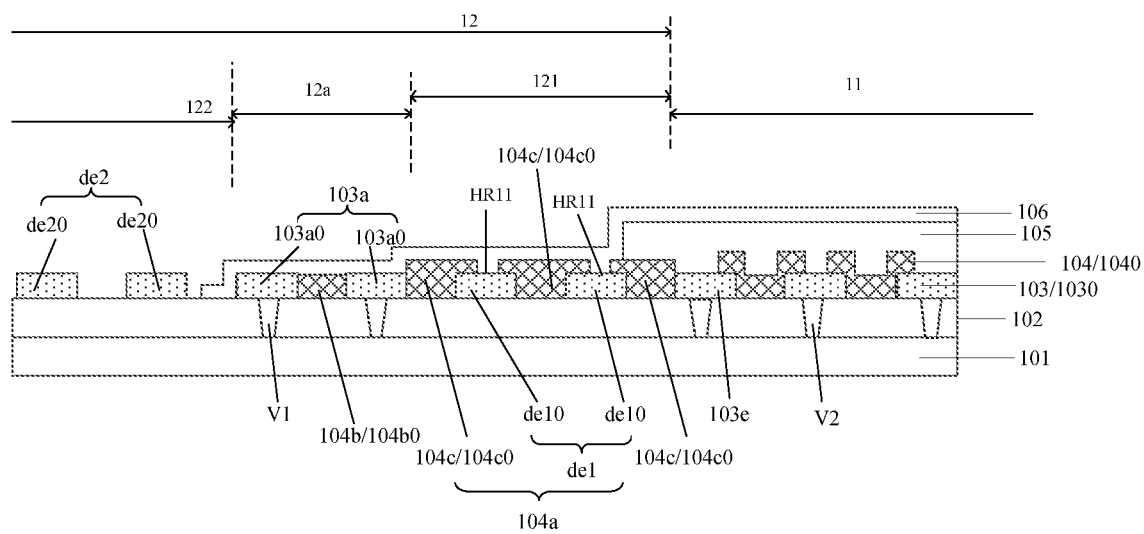
FIG. 14A is a cross-sectional view of a display substrate provided by an embodiment of the present disclosure.

FIG. 14A is a cross-sectional view of a display substrate provided by an embodiment of the present disclosure. As illustrated in FIG. 14A, Compared with the display substrate 200a illustrated in FIG. 13A, the display substrate 200b differs in that the insulation filling layer 104c can include a plurality of hollow regions HR11 so as to expose the plurality of first dummy electrodes de10, respectively; and the second electrode 106 is connected with the first dummy electrode de10 by the hollow region in the insulation filling layer 104c. The insulation filling layer 104c includes a plurality of insulation filling portions 104c0. As illustrated in FIG. 14A, the insulation filling portion 104c0 is located between adjacent first dummy electrodes de10, or located between adjacent first dummy electrode de10 and edge first-electrode 103e, or located between adjacent first dummy electrode de10 and connecting electrode 103a0.

Figure 14B:
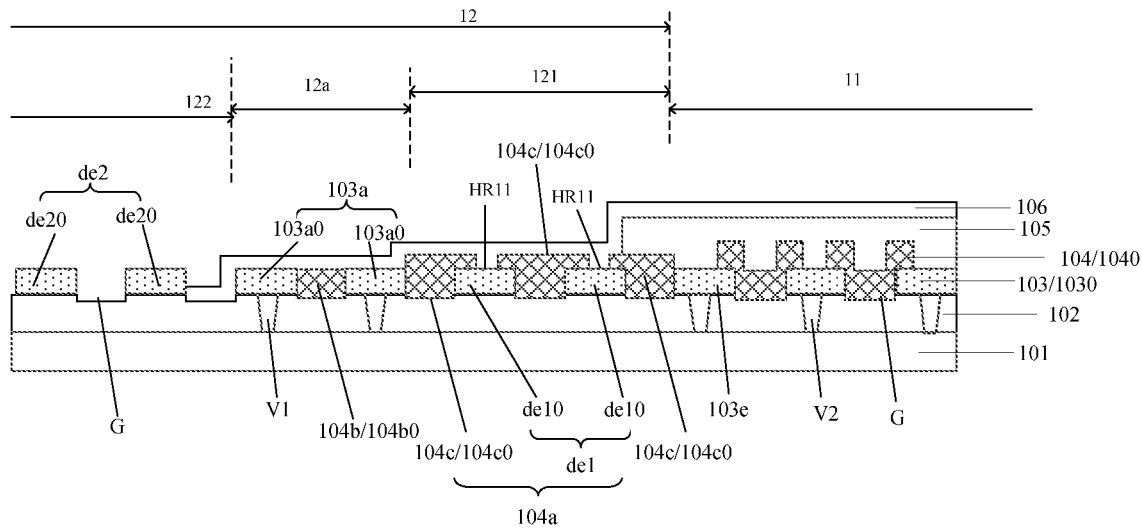
FIG. 14B is a cross-sectional view of a display substrate provided by an embodiment of the present disclosure.

FIG. 14B is a cross-sectional view of a display substrate provided by an embodiment of the present disclosure. Compared with the display substrate 200b illustrated in FIG. 14A, the display substrate 200bb illustrated in FIG. 14B differs in that a groove G is disposed in the first insulation layer 102 of the display substrate 200bb. As illustrated in FIG. 14B, a size of the groove G in the first insulation layer 102, which is located in the display region 11, in the direction perpendicular to the base substrate 101 is equal to that of the groove G in the first insulation layer 102, which is located in the peripheral region 12, in the direction perpendicular to the base substrate 101. For example, the sizes of all the grooves G in the first insulation layer 102 in the direction perpendicular to the base substrate 101 are all equal. As illustrated in FIG. 14B, the sizes of the groove G in the first insulation layer 102, which is located in the second dummy region 122, the groove G in the first insulation layer 102, which is located in the connecting electrode region 12a, the groove G in the first insulation layer 102, which is located in the first dummy region 121 and the groove G in the first insulation layer 102, which is located in the display region 11, in the direction perpendicular to the base substrate 101 are all equal.

Figure 15:
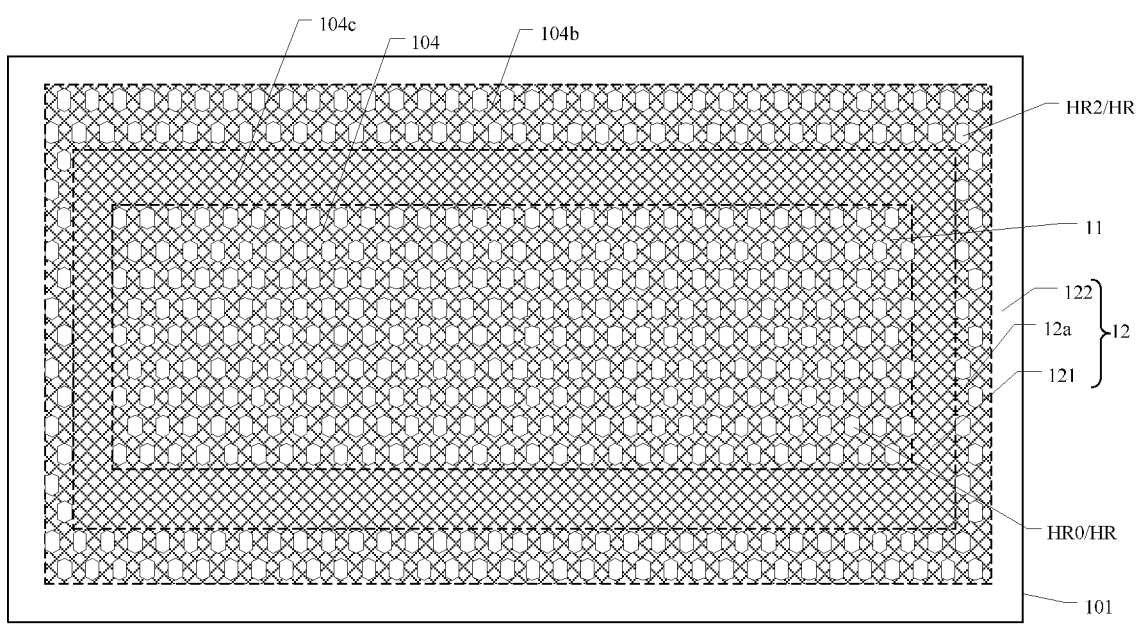
FIG. 15 is a top view of an insulation filling layer, a second filling layer and a pixel defining layer in a display substrate provided by an embodiment of the present disclosure.

FIG. 15 is a top view of an insulation filling layer, a second filling layer and a pixel defining layer in a display substrate provided by an embodiment of the present disclosure. FIG. 15 illustrates the insulation filling layer 104c, the second filling layer 104b and the pixel defining layer 104. As illustrated in FIG. 15, a patterned structure of a pixel defining thin film includes a plurality of hollow regions HR. The plurality of hollow regions HR include a hollow region HR0 located in the display region 11 and a hollow region HR2 located in the second dummy region 122. The hollow region HR0 is configured to expose the first electrode 1030, and the hollow region HR2 is configured to expose the connecting electrode 103a0. The top view of the insulation filling layer, the second filling layer and the pixel defining layer, as illustrated in FIG. 15, can be a top view of the insulation filling layer 104c, the second filling layer 104b and the pixel defining layer 104 in FIG. 13A. For example, a top view of the first filling layer, the second filling layer and the pixel defining layer illustrated in FIG. 14A can refer to FIG. 10, without limited thereto.

At least one embodiment of the present disclosure further provides a display device, including any one display substrate in the second aspect. For example, the display device includes a micro OLED display device.

At least one embodiment of the present disclosure further provides a manufacturing method of a display substrate, which includes: forming a first electrode pattern 103, the first electrode pattern 103 being located in a display region 11 of the display substrate and including a plurality of first electrodes 1030 spaced apart from each other, and the first electrode 1030 being configured to receive a pixel driving signal; forming a connecting electrode pattern 103a, the connecting electrode pattern 103a being located in a connecting electrode region 12a of the display substrate and including a plurality of connecting electrodes 103a0, and the connecting electrode region 12a surrounding the display region 11; and forming a second electrode 106, the second electrode 106 being located in the display region 11 and a peripheral region 12, the second electrode 106 being connected with the connecting electrode pattern 103a, the second electrode 106 and the first electrode pattern 103 being spaced apart from each other, and the second electrode being configured to receive a first power signal. A plurality of connecting electrodes 103a0 surround a plurality of first electrodes 1030. The connecting electrode 103a0 is of a block shape.

In a manufacturing method of a display substrate, as provided by an embodiment of the present disclosure, in order to improve etching evenness, a pattern density of the connecting electrode pattern 103a is the same as that of the first electrode pattern 103.

A manufacturing method of a display substrate, as provided by an embodiment of the present disclosure, further includes: forming a first dummy electrode pattern de1, the first dummy electrode pattern de1 being located in a first dummy region 121 of the display substrate and including a plurality of first dummy electrodes de10; the first dummy region 121 is located between the connecting electrode region 12a and the display region 11; and in order to improve etching evenness, a pattern density of the first dummy electrode pattern de1 is the same as that of the first electrode pattern 103. For example, the first dummy electrode de10 is of a block shape. The peripheral region 12 includes the connecting electrode region 12a and the first dummy region 121.

A display manufacturing method of a display substrate, as provided by an embodiment of the present disclosure, further includes: forming a second dummy electrode pattern de2, the second dummy electrode pattern de2 is located in a second dummy region 122 of the display substrate and includes a plurality of second dummy electrodes de20; the second dummy region 122 is located at a side of the connecting electrode region 12a away from the display region 11; and in order to improve etching evenness, a pattern density of the second dummy electrode pattern de2 is the same as that of the first electrode pattern 103. For example, the second dummy electrode de20 is of a block shape. The peripheral region 12 includes the connecting electrode region 12a, the first dummy region 121 and the second dummy region 122.

In a manufacturing method of a display substrate, as provided by an embodiment of the present disclosure, a first filling layer 104a is formed in the first dummy region 121, the first filling layer 104a includes a plurality of first dummy electrodes de10 and an insulation filling layer 104c, the first electrode pattern 103 includes an edge first-electrode 103e adjacent to the connecting electrode 103a0, and the insulation filling layer 104c is in contact with the connecting electrode 103a0 and the edge first-electrode 103e, respectively.

In a manufacturing method of a display substrate, as provided by an embodiment of the present disclosure, the second electrode 106 is in contact with the insulation filling layer 104c.

In a manufacturing method of a display substrate, as provided by an embodiment of the present disclosure, the edge first-electrode 103e and the plurality of first dummy electrodes de10 are insulated from each other.

In a manufacturing method of a display substrate, as provided by an embodiment of the present disclosure, the manufacturing method further includes: forming a pixel defining layer 104, the pixel defining layer 104 includes a plurality of pixel defining portions 1040, and each of the plurality of pixel defining portions 1040 is located between adjacent first electrodes 1030.

In a manufacturing method of a display substrate, as provided by an embodiment of the present disclosure, the insulation filling layer 104c and the pixel defining layer 104 are formed of the same film layer by the same patterning process.

In a manufacturing method of a display substrate, as provided by an embodiment of the present disclosure, the first electrode pattern 103 and the connecting electrode pattern 103a are formed of the same film layer by the same patterning process.

A manufacturing method of a display substrate, as provided by an embodiment of the present disclosure, further includes: forming a second filling layer 104b, the second filling layer 104b includes at least one second filling portion 104b0, and the second filling portion 104b0 is located between adjacent connecting electrodes 103a0. For example, the second filling portion 104b0 is in contact with the adjacent connecting electrodes 103a0, respectively. For example, the second filling layer 104b is an insulation layer. In a manufacturing method of a display substrate, as provided by an embodiment of the present disclosure, the second filling layer 104b and the first filling layer 104a are formed of the same film layer by the same patterning process.

A manufacturing method of a display substrate, as provided by an embodiment of the present disclosure, further includes: forming a light-emitting functional layer 105, the light-emitting functional layer 105 is located between the first electrode pattern 103 and the second electrode 106, and the light-emitting functional layer 105 is in contact with the first filling layer 104a.

In a manufacturing method of a display substrate, as provided by an embodiment of the present disclosure, the light-emitting functional layer 105 is in contact with a part of the first filling layer 104a.

A manufacturing method of a display substrate, as provided by an embodiment of the present disclosure, includes: forming a first electrode pattern, the first electrode pattern being located in a display region of the display substrate and including a plurality of first electrodes spaced apart from each other; forming a connecting electrode pattern, the connecting electrode pattern being located in a peripheral region of the display substrate and including a plurality of connecting electrodes; and forming a second electrode, the second electrode being located in the display region and the peripheral region and connected with the connecting electrode pattern, and the second electrode and the first electrode pattern being spaced apart from each other. The connecting electrode pattern surrounds the first electrode pattern, and the connecting electrode is of a block shape.

A manufacturing method of a display substrate, as provided by an embodiment of the present disclosure, includes: forming an insulation thin film on a base substrate 101, and patterning the insulation thin film to form a first via hole V1 and a second via hole V2 so as to form the first insulation layer 102; filling a conductive material in the first via hole V1 and the second via hole V2 to form connecting elements, respectively; forming a conductive thin film on the first insulation layer 102 and the connecting elements, and performing a single patterning process on the conductive thin film so as to simultaneously form the first electrode pattern 103, the connecting electrode pattern 103a and the first dummy electrode pattern de1, the connecting electrode pattern 103a including a plurality of connecting electrodes 103a0; forming a pixel defining thin film on the first electrode pattern 103, the connecting electrode pattern 103a and the first dummy electrode pattern de1, and performing a single patterning process on the pixel defining thin film so as to simultaneously form the pixel defining layer 104, the insulation filling layer 104c and the second filling layer 104b; forming a light-emitting functional layer 105 on the pixel defining layer 104 and the insulation filling layer 104c; and forming a second electrode 106 on the light-emitting functional layer 105. The display substrate illustrated in FIG. 13A can be formed by using this method.

A manufacturing method of a display substrate, as provided by an embodiment of the present disclosure, includes: forming an insulation thin film on a base substrate 101, and patterning the insulation thin film to form a first via hole V1 and a second via hole V2 so as to form a first insulation layer 102; filling a conductive material in the first via hole V1 and the second via hole V2 to form the connecting elements, respectively; forming a conductive thin film on the first insulation layer 102 and the connecting elements, and performing a single patterning process on the conductive thin film so as to simultaneously form a first electrode pattern 103, a connecting electrode pattern 103a and a first dummy electrode pattern de1, the connecting electrode pattern 103a including a plurality of connecting electrodes 103a0; forming a pixel defining thin film on the first electrode pattern 103, the connecting electrode pattern 103a and the first dummy electrode pattern de1, and performing a single patterning process on the pixel defining thin film so as to simultaneously form the pixel defining layer 104, at least one insulation filling portion 104c0 and a second filling layer 104b; forming a light-emitting functional layer 105 on the pixel defining layer 104 and the at least one insulation filling portion 104c0; and forming a second electrode 106 on the light-emitting functional layer 105. The display substrate illustrated in FIG. 14A can be formed by using this method.

In the third aspect, in order to reduce the height fall of the second electrode 106 and/or improve etching evenness, embodiments of the present disclosure provide a display substrate and a manufacturing method thereof, and a display device.

Figure 16:
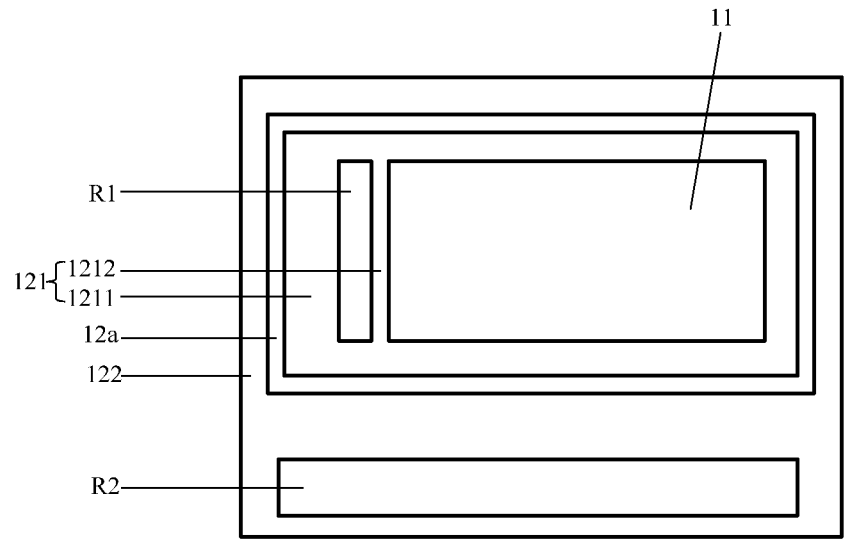
FIG. 16 is a schematic diagram of region partitioning of a display substrate provided by an embodiment of the present disclosure.

FIG. 16 is a schematic diagram of region partitioning of a display substrate provided by an embodiment of the present disclosure. Compared with the display substrate illustrated in FIG. 11, a display substrate further includes a sensor region R1, and a portion of the first dummy region 121, which is located between the sensor region R1 and the connecting electrode region 12a, is a first dummy sub region 1211; and a second dummy sub region 1212 is located between the sensor region R1 and the display region 11. FIG. 16 further illustrates a pad region R2. The pad region R2 can be used for being externally connected with a circuit.

Figure 17A:
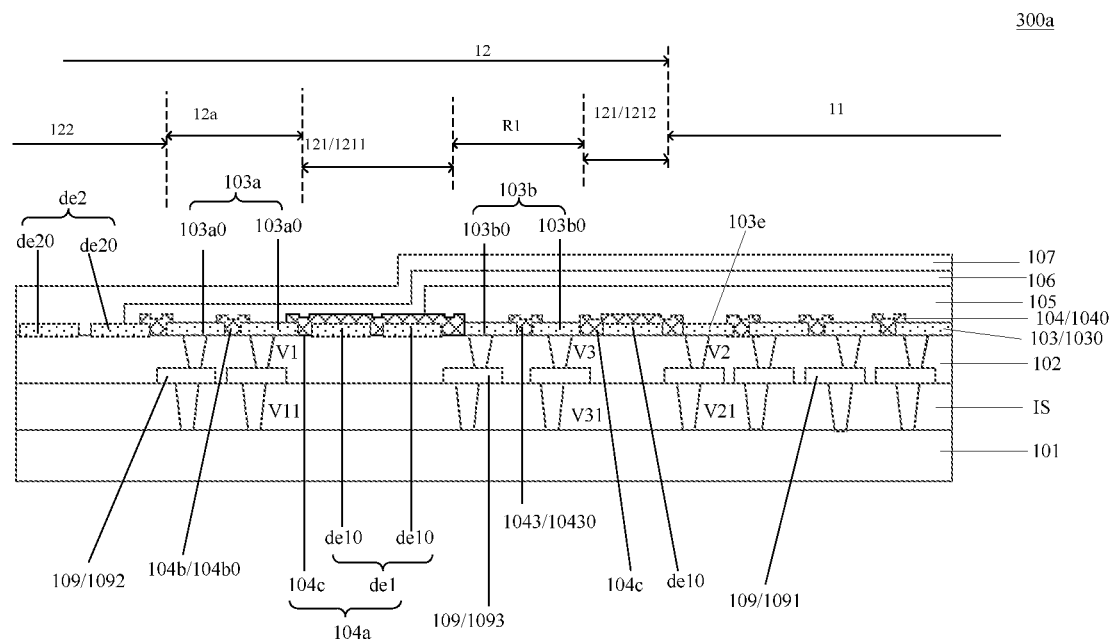
FIG. 17A is a schematic cross-sectional view of a display substrate provided by an embodiment of the present disclosure.

FIG. 17A is a schematic cross-sectional view of a display substrate provided by an embodiment of the present disclosure. FIG. 17A can be a schematic cross-sectional view of a display substrate illustrated in FIG. 18 taken along line M-N. As illustrated in FIG. 17A, the display substrate 300a includes: a first electrode pattern 103, a connecting electrode pattern 103a and a first dummy electrode pattern de1. The first electrode pattern 103 is located in a display region 11 of the display substrate, and includes a plurality of first electrodes 1030 spaced apart from each other. The first electrode is configured to receive a pixel driving signal. The connecting electrode pattern 103a is located in a connecting electrode region 12a of the display substrate, and includes a plurality of connecting electrodes 103a0. At least two of the plurality of connecting electrodes 103a0 are each of a block shape and are spaced apart from each other. The first dummy electrode pattern de1 is located in a first dummy region 121 of the display substrate, and includes a plurality of first dummy electrodes de10. The first dummy electrode pattern de1 is provided to facilitate improving etching evenness.

As illustrated in FIG. 16 and FIG. 17A, the connecting electrode region 12a surrounds the display region 11, and the first dummy region 121 is located between the connecting electrode region 12a and the display region 11. The connecting electrode pattern 103a surrounds the first electrode pattern 103, and the first dummy electrode pattern de1 surrounds the first electrode pattern 103. The first dummy electrode pattern de1 is located between the connecting electrode pattern 103a and the first electrode pattern 103. For example, the connecting electrode pattern 103a is of a ring shape.

For example, as illustrated in FIG. 17A, the display substrate provided by an embodiment of the present disclosure further includes a second electrode 106, the second electrode 106 is connected with the connecting electrode 103a0; a peripheral region 12 of the display substrate surrounds the display region 11, and the peripheral region 12 includes the connecting electrode region 12a and the first dummy region 121; and the second electrode 106 is located in the display region 11 and the peripheral region 12, and the second electrode 106 and the first electrode pattern 103 are spaced apart from each other. The second electrode is configured to receive a first power signal.

For example, as illustrated in FIG. 17A, at least one selected from the group consisting of a pattern density of the connecting electrode pattern 103a and a pattern density of the first dummy electrode pattern de1 is the same as that of the first electrode pattern 103.

For example, as illustrated in FIG. 17A, the display substrate provided by an embodiment of the present disclosure further includes a sensor electrode pattern 103b, the sensor electrode pattern 103b being located in a sensor region R1 of the display substrate and including a plurality of sensor electrodes 103b0. The sensor electrode 103b0 is configured to receive a detection driving signal. For example, a pattern density of the sensor electrode pattern 103b is the same as that of the first electrode pattern 103.

For example, as illustrated in FIG. 17A, the display substrate provided by an embodiment of the present disclosure further includes a second dummy electrode pattern de2, the second dummy electrode pattern de2 being located in a second dummy region 122 of the display substrate and including a plurality of second dummy electrodes de20; and the second dummy region 122 is located at a side of the connecting electrode region 12a away from the display region 11. For example, a pattern density of the second dummy electrode pattern de2 is the same as that of the first electrode pattern 103. In the display substrate provided by an embodiment of the present disclosure, the pattern density of the first electrode pattern 103, the pattern density of the connecting electrode pattern 103a, the pattern density of the sensor electrode pattern 103b, the pattern density of the first dummy electrode pattern de1 and the pattern density of the second dummy electrode pattern de2 are all the same.

For example, as illustrated in FIG. 17A, a first filling layer 104a is arranged in the first dummy sub region 1211; the first filling layer 104a includes a plurality of first dummy electrodes de10 and an insulation filling layer 104c; and the first electrode pattern 103 includes an edge first-electrode 103e adjacent to the connecting electrode 103a0, and the insulation filling layer 104c is in contact with the connecting electrode 103a0 and the edge first-electrode 103e, respectively. For example, as illustrated in FIG. 17A, the second electrode 106 is in contact with the insulation filling layer 104c. For example, as illustrated in FIG. 17A, the edge first-electrode 103e and the plurality of first dummy electrodes de10 are insulated from each other.

For example, as illustrated in FIG. 17A, the display substrate further includes a pixel defining layer 104, the pixel defining layer 104 includes a plurality of pixel defining portions 1040, and each of the plurality of pixel defining portions 1040 is located between adjacent first electrodes 1030.

For example, as illustrated in FIG. 17A, the insulation filling layer 104c and the pixel defining layer 104 are located in the same layer, and can be formed of the same film layer by the same patterning process so as to save a manufacturing process.

For example, as illustrated in FIG. 17A, the first electrode pattern 103, the connecting electrode pattern 103a, the sensor electrode pattern 103b, the first dummy electrode pattern de1 and the second dummy electrode pattern de2 are located in the same layer, and can be formed of the same film layer by the same patterning process so as to save a manufacturing process.

For example, as illustrated in FIG. 17A, the display substrate further includes a second filling layer 104b, the second filling layer 104b includes at least one second filling portion 104b0, and the second filling portion 104b0 is located between adjacent connecting electrodes 103a0. For example, the second filling layer 104b is an insulation layer. For example, as illustrated in FIG. 17A, the second filling portion 104b0 is in contact with adjacent connecting electrodes 103a0, respectively.

For example, as illustrated in FIG. 17A, the second filling layer 104b and the first filling layer 104a are located in the same layer, and can be formed of the same film layer by the same patterning process so as to save a manufacturing process.

For example, as illustrated in FIG. 17A, the display substrate further includes a third filling layer 1043, the third filling layer 1043 includes a plurality of third filling portions 10430, and the third filling portion 10430 is located between at least one selected from the group consisting of adjacent sensor electrodes 103b0, and adjacent sensor electrode 103b0 and first dummy electrodes. FIG. 17A is illustrated with reference to the case where the third filling portion 10430 is located between adjacent sensor electrodes 103b0, by way of example.

For example, as illustrated in FIG. 17A, the third filling layer 1043 and the pixel defining layer 104 are located in the same layer, and can be formed of the same film layer by the same patterning process so as to save a manufacturing process. For example, as illustrated in FIG. 17A, the pixel defining layer 104, the insulation filling layer 104c, the second filling layer 104b and the third filling layer 1043 are located in the same layer.

For example, as illustrated in FIG. 17A, the display substrate further includes a light-emitting functional layer 105, the light-emitting functional layer 105 is located between the first electrode pattern 103 and the second electrode 106, and the light-emitting functional layer 105 is in contact with the first filling layer 104a. For example, the light-emitting functional layer 105 is in contact with a part of the first filling layer 104a. For example, as illustrated in FIG. 17A, the light-emitting functional layer 105 extends to the first dummy sub region 1211. The light-emitting functional layer 105 covers the overall display region 11, sensor region R1 and second dummy sub region 1212 and a part of the first dummy sub region 1211 so as to prevent the case where the light-emitting functional layer 105 is evaporated to the connecting electrode region 122 to cause the short circuit of the first electrode and the second electrode. For example, as illustrated in FIG. 17A, the second electrode 106 extends to the second dummy region 122 of the peripheral region 12 from the display region 11 so as to facilitate connection between the second electrode 106 and the connecting electrode 103a0.

For example, as illustrated in FIG. 17A, the light-emitting functional layer 105 is in contact with the sensor electrode pattern 103b. For example, as illustrated in FIG. 17A, the light-emitting functional layer 105 is not in contact with the first dummy electrode de10 in the second dummy sub region 1212, without limited thereto.

As illustrated in FIG. 17A, a second insulation layer IS is also arranged on the base substrate 101, a conductive pattern 109 is arranged on the second insulation layer IS, and the conductive pattern 109 includes a first conductive portion 1091, a second conductive portion 1092, and a third conductive portion 1093. The second insulation layer IS includes a third via hole V11, a fourth via hole V21 and a fifth via hole V31. A conductive material is filled in the third via hole V11, the fourth via hole V21 and the fifth via hole V31 so as to form connecting elements, respectively. The first electrode 1030 is connected with the connecting element in the fourth via hole V21 through the first conductive portion 1091. The connecting electrode 103a0 is connected with the connecting element in the third via hole V11 through the second conductive portion 1092. The sensor electrode 103b0 is connected with the connecting element in the fifth via hole V31 through the third conductive portion 1093. It should be noted that other structures are also arranged between the base substrate 101 and the second insulation layer IS, and the other structures are not illustrated in FIG. 17A.

As illustrated in FIG. 17A, the display substrate further includes an encapsulation layer 107. The encapsulation layer 107 is configured to encapsulate a light-emitting element so as to avoid water and oxygen invasion. As illustrated in FIG. 17A, the encapsulation layer 107 covers the second electrode 106 and the second dummy electrode pattern de2. As illustrated in FIG. 17A, the encapsulation layer 107 can cover the overall base substrate 101 and the structures thereon.

Figure 17B:
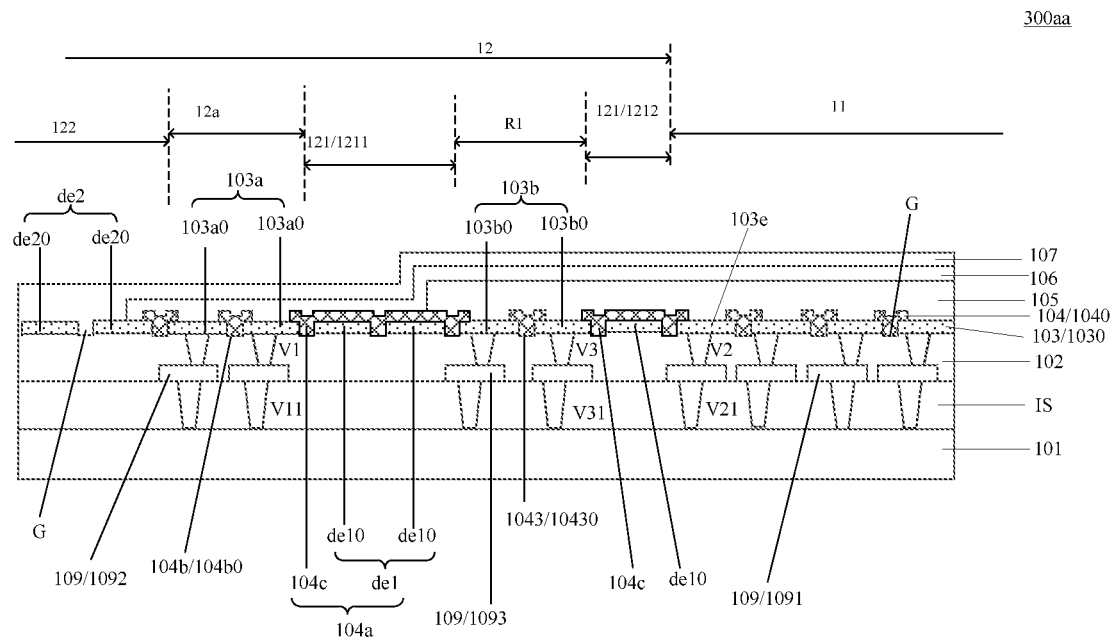
FIG. 17B is a schematic cross-sectional view of a display substrate provided by an embodiment of the present disclosure.

FIG. 17B is a schematic cross-sectional view of a display substrate provided by an embodiment of the present disclosure. Compared with the display substrate 300a illustrated in FIG. 17A, the display substrate 300aa illustrated in FIG. 17B differs in that a groove G is disposed in the first insulation layer 102 of the display substrate 300aa. As illustrated in FIG. 17B, a size of the groove G in the first insulation layer 102, which is located in the display region 11, in a direction perpendicular to the base substrate 101 is equal to that of the groove G in the first insulation layer 102, which is located in the peripheral region 12, in the direction perpendicular to the base substrate 101. For example, the sizes of all the grooves G in the first insulation layer 102 in the direction perpendicular to the base substrate 101 are all equal. As illustrated in FIG. 17B, the sizes of the groove G in the first insulation layer 102, which is located in the second dummy region 122, the groove G in the first insulation layer 102, which is located in the connecting electrode region 12a, the groove G in the first insulation layer 102, which is located in the first dummy region 121 (which includes the first dummy sub region 1211 and the second dummy sub region 1212), the groove G in the first insulation layer 102, which is located in the sensor region R1, and the groove G in the first insulation layer 102, which is located in the display region 11, in the direction perpendicular to the base substrate 101 are all equal.

Figure 18:
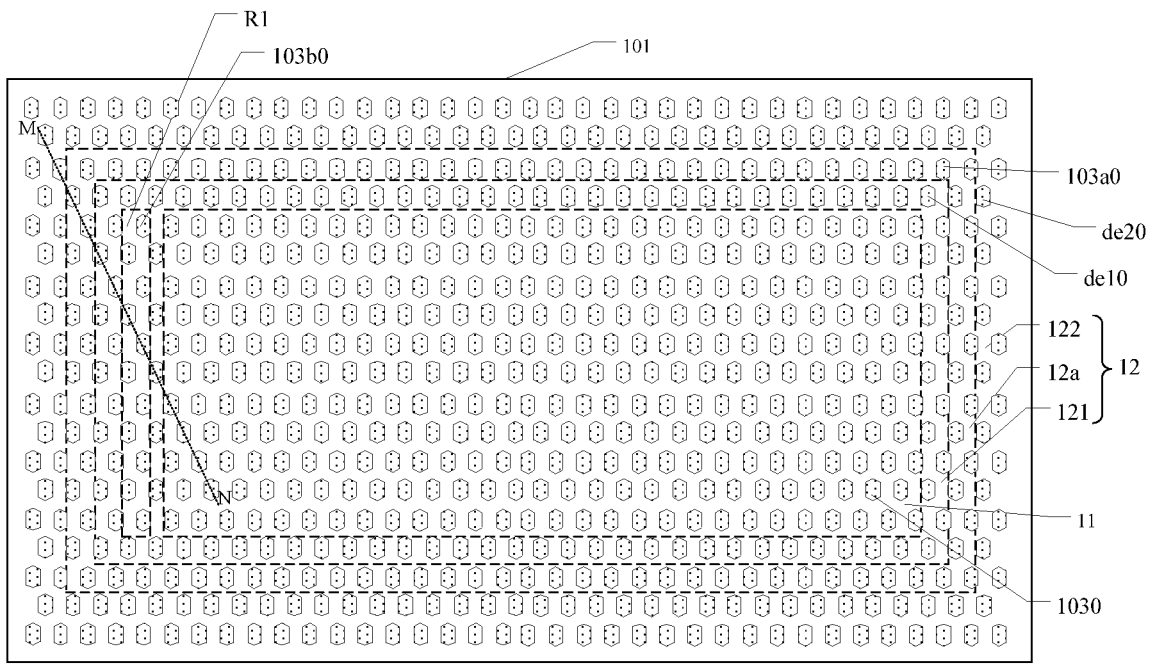
FIG. 18 is a schematic cross-sectional view of a display substrate provided by an embodiment of the present disclosure.

FIG. 18 is a top view of a structure formed after a conductive thin film in a display substrate provided by an embodiment of the present disclosure is patterned. Other structures in the display substrate are not illustrated, and can refer to FIG. 17A or FIG. 17B. Compared with the structure illustrated in FIG. 12, the sensor electrode 103b0 is illustrated in FIG. 18. As illustrated in FIG. 18, a shape of the sensor electrode 103b0, a shape of the first electrode 1030, a shape of the connecting electrode 103a0, a shape of the first dummy electrode de10, and a shape of the second dummy electrode de20 are the same, without limited thereto. As illustrated in FIG. 18, a pattern density of the sensor electrode pattern 103b, a pattern density of the first electrode pattern 103, a pattern density of the connecting electrode pattern 103a, a pattern density of the first dummy electrode pattern de1, and a pattern density of the second dummy electrode pattern de2 are the same. Namely, a pattern density of the plurality of sensor electrodes 103b0, a pattern density of the plurality of first electrodes 1030, a pattern density of the plurality of connecting electrodes 103a0, a pattern density of the plurality of first dummy electrodes de10, and a pattern density of the plurality of second dummy electrodes de20 are the same.

For example, as illustrated in FIG. 18, the first dummy electrode de10 is of a block shape. The block-shaped first dummy electrode de10 can also refer to FIG. 12.

For example, as illustrated in FIG. 18, the second dummy electrode de20 is of a block shape. The block-shaped second dummy electrode de20 can also refer to FIG. 12.

For example, as illustrated in FIG. 18, the sensor electrode 103b0, the first electrode 1030, the connecting electrode 103a0, the first dummy electrode de10 and the second dummy electrode de20 are all of a block shape.

Figure 19:
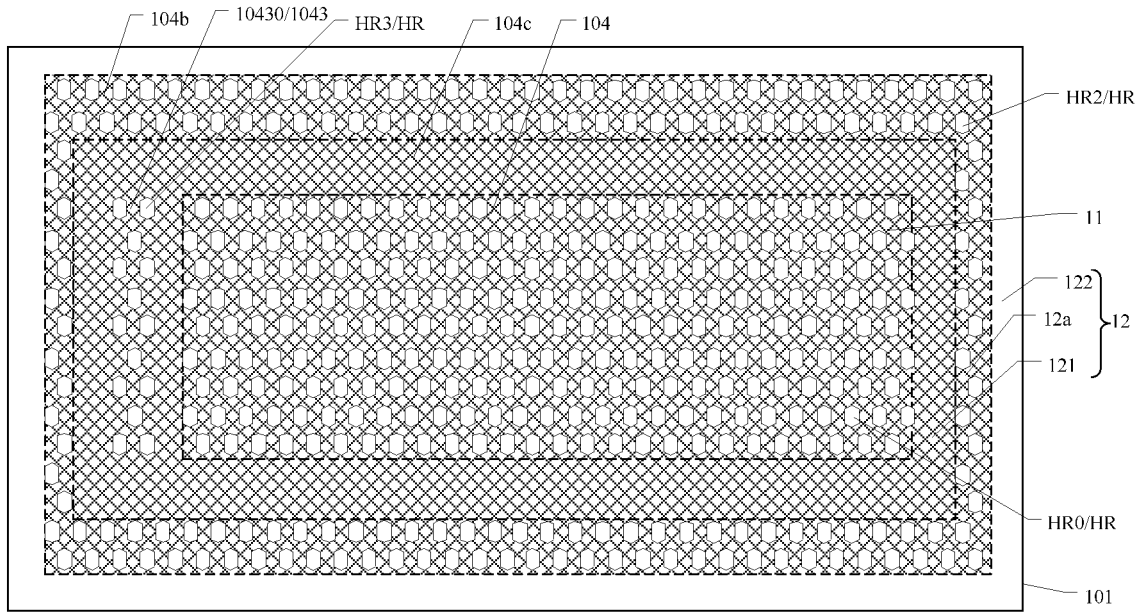
FIG. 19 is a top view of a structure formed after a pixel defining thin film in a display substrate provided by an embodiment of the present disclosure is patterned.

FIG. 19 is a top view of a structure formed after a pixel defining thin film in a display substrate provided by an embodiment of the present disclosure is patterned. Compared with the structure illustrated in FIG. 15, FIG. 19 illustrates the third filling portion 10430 and a hollow region HR3. The hollow region HR3 is configured to expose the sensor electrode 103b0 (which is not illustrated in FIG. 19, and referring to FIG. 17A and FIG. 17B).

Figure 20:
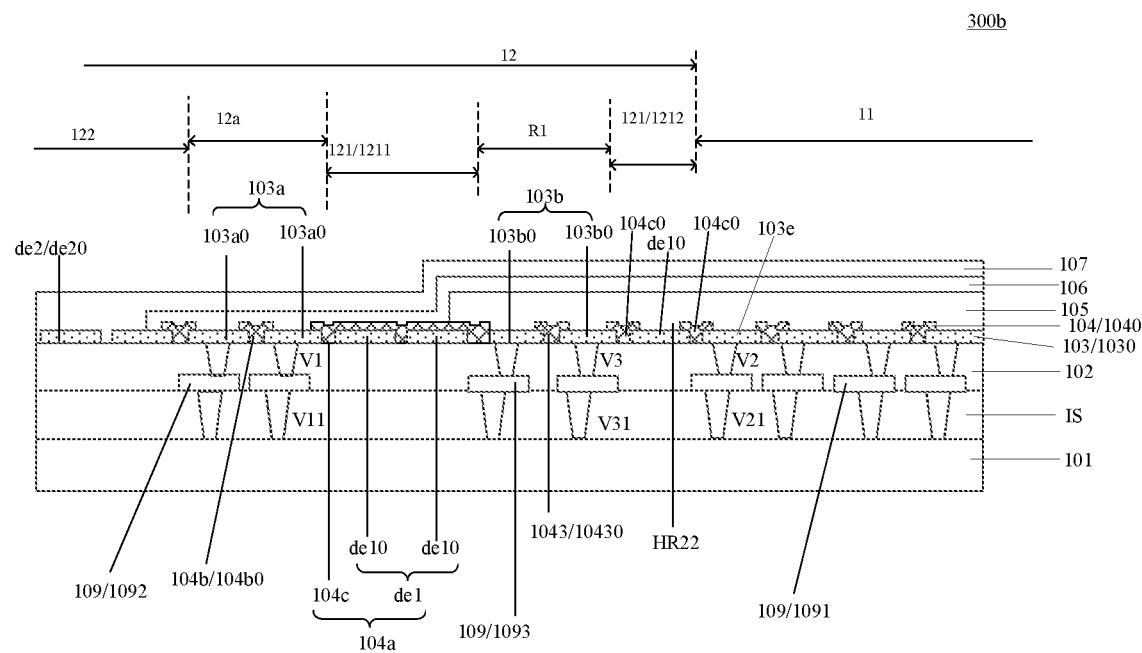
FIG. 20 is a cross-sectional view of a display substrate provided by an embodiment of the present disclosure.

FIG. 20 is a cross-sectional view of a display substrate provided by an embodiment of the present disclosure. Compared with the display substrate 300a illustrated in FIG. 17A, the display substrate 300b illustrated in FIG. 20 differs in that a portion of the insulation filling layer 104c, which is located in the second dummy sub region 1212, includes a hollow region HR22. The hollow region HR22 is configured to expose the first dummy electrode de10 located in the second dummy sub region 1212. The light-emitting functional layer 105 is in contact with the first dummy electrode de10 located in the second dummy sub region 1212. As illustrated in FIG. 17A and FIG. 20, the light-emitting functional layer 105 is not in contact with the first dummy electrode de10 located in the first dummy sub region 1211.

At least one embodiment of the present disclosure further provides a display device, which includes any one display substrate in the third aspect. The display device includes a micro OLED display device, without limited thereto. Compared with the display substrate provided in the second aspect, the display substrate provided in the third aspect additionally has the sensor region R1, and the rest can refer to the description in the second aspect.

At least one embodiment of the present disclosure further provides a manufacturing method of a display substrate, which includes: forming a first electrode pattern, the first electrode pattern being located in a display region of the display substrate and including a plurality of first electrodes spaced apart from each other, and the first electrode being configured to receive a pixel driving signal; forming a connecting electrode pattern, the connecting electrode pattern being located in a peripheral region of the display substrate and including a plurality of connecting electrodes; forming a second electrode, the second electrode being located in the display region and the peripheral region and connected with the connecting electrode pattern, the second electrode and the first electrode pattern being spaced apart from each other, and the second electrode being configured to receive a first power signal; forming a light-emitting functional layer, the light-emitting functional layer being located between the first electrode pattern and the second electrode; and forming a first dummy electrode pattern, the first dummy electrode pattern including a plurality of first dummy electrodes. The connecting electrode pattern surrounds the first electrode pattern, the first dummy electrode pattern is located between the connecting electrode pattern and the first electrode pattern, and at least two of the plurality of first dummy electrodes are each of a block shape and are spaced apart from each other.

At least one embodiment of the present disclosure further provides a manufacturing method of a display substrate, which includes: forming a first electrode pattern 103, the first electrode pattern 103 being located in a display region 11 of the display substrate and including a plurality of first electrodes 1030 spaced apart from each other; forming a connecting electrode pattern 103a, the connecting electrode pattern 103a being located in a connecting electrode region 12a of the display substrate and including a plurality of connecting electrodes 103a0; forming a second electrode 106, the second electrode 106 being located in the display region 11 and a peripheral region 12, the second electrode 106 being connected with the connecting electrode pattern 103a, and the second electrode 106 and the first electrode pattern 103 being spaced apart from each other; and forming a first dummy electrode pattern de1, the first dummy electrode pattern de1 being located in a first dummy region 121 of the display substrate and including a plurality of first dummy electrodes de10. The connecting electrode pattern 103a surrounds the first electrode pattern 103, and the first dummy electrode pattern is located between the connecting electrode pattern and the first electrode pattern. The first dummy electrode pattern de1 surrounds the first electrode pattern 103.

For example, the connecting electrode region 12a surrounds the display region 11, and the first dummy region 121 is located between the connecting electrode region 12a and the display region 11.

For example, in a manufacturing method of a display substrate, as further provided by at least one embodiment of the present disclosure, a pattern density of the first electrode pattern 103, a pattern density of the connecting electrode pattern 103a, and a pattern density of the first dummy electrode pattern de1 are the same.

For example, at least one embodiment of the present disclosure further provides a manufacturing method of a display substrate, which further includes: forming a second dummy electrode pattern de2, the second dummy electrode pattern de2 being located in a second dummy region 122 of the display substrate and including a plurality of second dummy electrodes de20. The second dummy region 122 is located at a side of the connecting electrode region 12a away from the display region 11, and a pattern density of the second dummy electrode pattern de2 and a pattern density of the first electrode pattern 103 are the same.

For example, at least one embodiment of the present disclosure further provides a manufacturing method of a display substrate, which further includes: forming a sensor electrode pattern 103b, the sensor electrode pattern 103b being located in a sensor region R1 of the display substrate and including a plurality of sensor electrodes 103b0. A pattern density of the sensor electrode pattern 103b is the same as that of the first electrode pattern 103.

For example, in a manufacturing method of a display substrate, as further provided by at least one embodiment of the present disclosure, a second dummy sub region 1212 is located between the sensor region R1 and the display region 11; a portion of the first dummy region 121, which is located between the sensor region R1 and the connecting electrode region 12a, is a first dummy sub region 1211; and a first filling layer 104a is formed in the first dummy sub region 1211, the first filling layer 104a includes a plurality of first dummy electrodes de10 and an insulation filling layer 104c, the first electrode pattern 103 includes an edge first-electrode 103e adjacent to the connecting electrode 103a0, and the insulation filling layer 104c is in contact with the connecting electrode 103a0 and the edge first-electrode 103e, respectively.

For example, in a manufacturing method of a display substrate, as further provided by at least one embodiment of the present disclosure, the second electrodes 106 is in contact with the insulation filling layer 104c.

For example, in a manufacturing method of a display substrate, as further provided by at least one embodiment of the present disclosure, the edge first-electrode 103e and the plurality of first dummy electrodes de10 are insulated from each other.

For example, in a manufacturing method of a display substrate, as further provided by at least one embodiment of the present disclosure, the method further includes: forming a pixel defining layer 104, the pixel defining layer 104 including a plurality of pixel defining portions 1040, and each of the plurality of pixel defining portions 1040 being located between adjacent first electrodes 1030.

For example, in a manufacturing method of a display substrate, as further provided by at least one embodiment of the present disclosure, the insulation filling layer 104c and the pixel defining layer 104 are formed of the same film layer by the same patterning process.

For example, in a manufacturing method of a display substrate, as further provided by at least one embodiment of the present disclosure, the first electrode pattern 103 and the connecting electrode pattern 103a are formed of the same film layer by the same patterning process.

For example, at least one embodiment of the present disclosure further provides a manufacturing method of a display substrate, which further includes: forming a second filling layer 104b, the second filling layer 104b including at least one second filling portion 104b0, and the second filling portion 104b0 being located between adjacent connecting electrodes 103a0. For example, the second filling portion 104b0 is in contact with the adjacent connecting electrodes 103a0, respectively. For example, the second filling layer 104b is an insulation layer. For example, the second filling layer 104b and the first filling layer 104a are formed of the same film layer by the same patterning process.

For example, at least one embodiment of the present disclosure further provides a manufacturing method of a display substrate, which further includes: forming a third filling layer 1043, the third filling layer 1043 including a plurality of third filling portions 10430, and the third filling portion 10430 being located between at least one selected from the group consisting of adjacent sensor electrodes 103b0, adjacent third dummy electrodes, and adjacent sensor electrode and third dummy electrode. For example, the third filling layer 1043 and the pixel defining layer 104 are formed of the same film layer by the same patterning process.

For example, in a manufacturing method of a display substrate, as further provided by at least one embodiment of the present disclosure, the light-emitting functional layer 105 is in contact with the first filling layer 104a. For example, the light-emitting functional layer 105 is in contact with a part of the first filling layer 104a. For example, the light-emitting functional layer 105 is in contact with the sensor electrode pattern 103b.

For example, in a manufacturing method of a display substrate, as further provided by at least one embodiment of the present disclosure, the light-emitting functional layer 105 is in contact with the first dummy electrode de10 located in the second dummy sub region.

A manufacturing method of a display substrate, as provided by an embodiment of the present disclosure, includes: forming an insulation thin film on a base substrate 101, and patterning the insulation thin film to form a first via hole V1, a second via hole V2 and a third via hole V3 so as to form a first insulation layer 102; filling a conductive material in the first via hole V1, the second via hole V2, and the third via hole V3 to form connecting elements, respectively; forming a conductive thin film on the first insulation layer 102 and the connecting elements, and performing a single patterning process on the conductive thin film so as to simultaneously form a first electrode pattern 103, a connecting electrode pattern 103a, a first dummy electrode pattern de1, a second dummy electrode pattern de2 and a sensor electrode pattern 103b, the connecting electrode pattern 103a including a plurality of connecting electrodes 103a0, the sensor electrode pattern 103b including a plurality of sensor electrodes 103b0, the first dummy electrode patterns de1 including a plurality of first dummy electrodes de10, and the second dummy electrode pattern de2 including a plurality of second dummy electrodes de20; forming a pixel defining thin film on the first electrode pattern 103, the connecting electrode pattern 103a, the first dummy electrode pattern de1, and the sensor electrode pattern 103b, and performing a single patterning process on the pixel defining thin film so as to simultaneously form a pixel defining layer 104, an insulation filling layer 104c, a second filling layer 104b, and a third filling layer 1043; forming a light-emitting functional layer 105 on the pixel defining layer 104, the insulation filling layer 104c and the third filling layer 1043; and forming the second electrode 106 on the light-emitting functional layer 105. The display substrates illustrated in FIG. 17A and FIG. 18 can be formed by using this method.

For example, in the embodiments of the present disclosure, a pattern density of an A pattern refers to a density of a plurality of As included in this pattern, for example, can refer to the number of the As within unit area, without limited thereto. For example, the pattern density of the first electrode pattern 103 can refer to a density of a plurality of first electrodes 1030 in the first electrode pattern 103, and other related contents can refer hereto.

For example, in the embodiments of the present disclosure, as illustrated in FIG. 5A, a first connecting element cn1 is located in the first via hole V1, and a second connecting element cn2 is located in the second via hole V2. Reference numerals in other drawings are not given.

For example, in the embodiments of the present disclosure, as illustrated in FIG. 9, FIG. 12 and FIG. 18, the connecting electrode pattern is of a ring shape.

For example, in the embodiments of the present disclosure, the base substrate 101 may include a silicon wafer, without limited thereto.

For example, in the embodiments of the present disclosure, at least one of the first insulation layer or the second insulation layer includes at least one selected from the group consisting of silicon oxide, silicon nitride, and silicon oxynitride.

For example, in the embodiments of the present disclosure, the sensor electrode may be configured to measure at least one of parameters such as a temperature, brightness and the like. For example, the structure of the sensor electrode can be the same as that of the sub pixel of the display region.

For example, in the embodiments of the present disclosure, the block-shaped element is one pattern, and does not have a hollow region inside. For example, in the embodiments of the present disclosure, the first electrode pattern 103 is not of a block shape; and there is the hollow region between different first electrodes 1030 that the first electrode pattern 103 includes, while the first electrode 1030 is of a block shape, because there is no hollow region in the first electrode 1030.

For example, in the embodiments of the present disclosure, the display region includes a plurality of light-emitting elements, the plurality of light-emitting elements can emit light for image display, and the peripheral region does not emit light.

Figure 21:
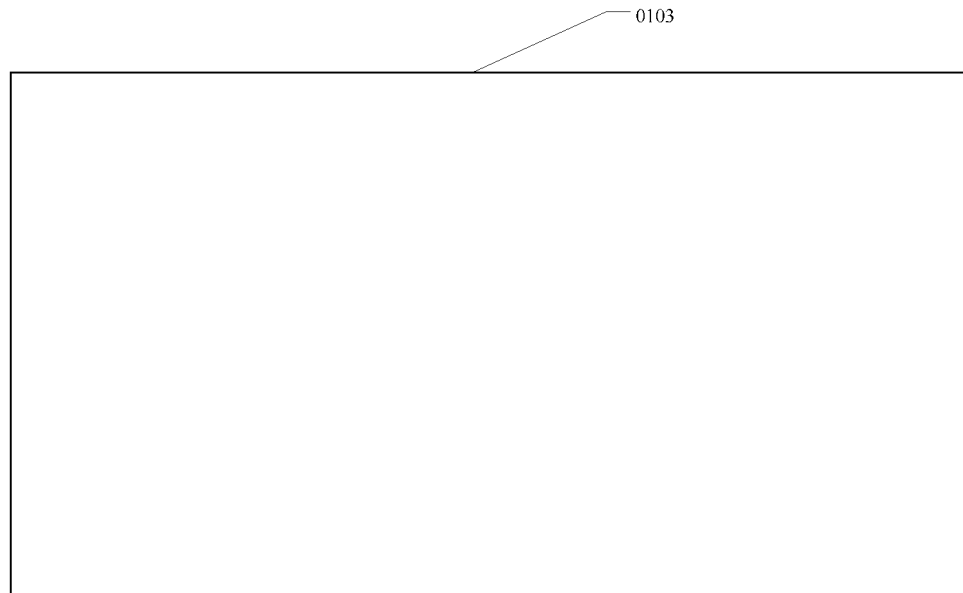
FIG. 21 is a schematic diagram of a conductive thin film formed in a manufacturing method of a display substrate, as provided by an embodiment of the present disclosure.

FIG. 21 is a schematic diagram of a conductive thin film formed in a manufacturing method of a display substrate, as provided by an embodiment of the present disclosure. A conductive thin film 0103 may cover the base substrate in an entire surface mode and is subjected to the patterning process to form the first electrode pattern and the element located in the same layer as the first electrode pattern. The element located in the same layer as the first electrode pattern includes at least one selected from the group consisting of the connecting electrode pattern, the first dummy electrode pattern, the second dummy electrode pattern, the sensor electrode pattern and the like. In the embodiments of the present disclosure, the conductive thin film is directly formed on the first insulation layer 102, and the structure formed by the conductive thin film through patterning is in contact with the first insulation layer 102. The structure formed by the conductive thin film through patterning includes at least one selected from the group consisting of the first electrode, the connecting electrode, the first dummy electrode, the second dummy electrode, and the sensor electrode.

Figure 22:
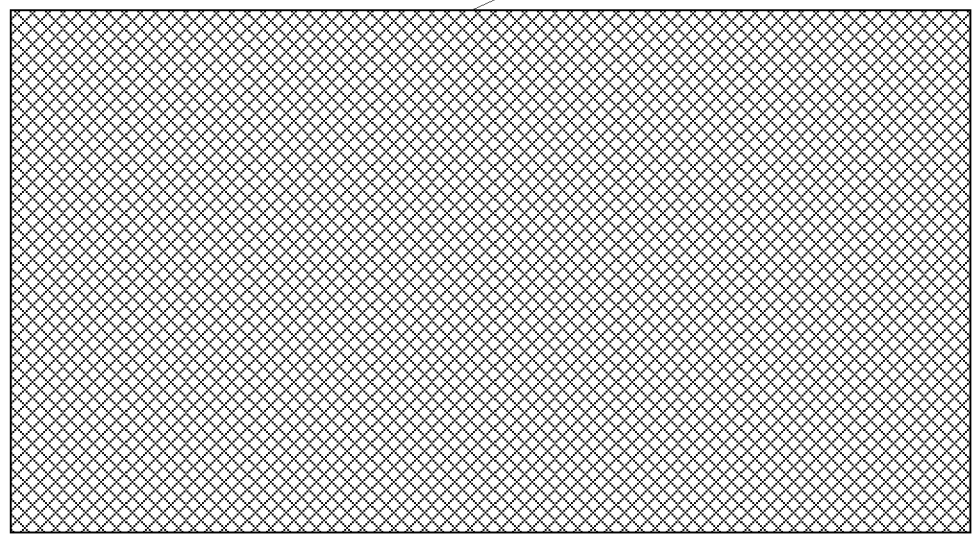
FIG. 22 is a schematic diagram of a pixel defining thin film formed in a manufacturing method of a display substrate, as provided by an embodiment of the present disclosure.

FIG. 22 is a schematic diagram of a pixel defining thin film formed in a manufacturing method of a display substrate, as provided by an embodiment of the present disclosure. A pixel defining thin film 0104 may cover the base substrate in an entire surface mode, and is subjected to the patterning process to form the pixel defining layer and the element located in the same layer as the pixel defining layer. The element located in the same layer as the pixel defining layer includes at least one selected from the group consisting of the first filling layer, the insulation filling layer, the second filling layer, and the third filling layer.

In the embodiments of the present disclosure, the groove in the first insulation layer 102, which is located in the display region 11, can be called as a first groove G1, and the groove in the first insulation layer 102, which is located in the peripheral region 12, can be called as a second groove G2.

In the embodiments of the present disclosure, as illustrated in FIG. 7A to FIG. 8B, the via hole is not provided in a portion of the first insulation layer 102, which overlaps with the plurality of conductive filling portions 103d1 in the direction perpendicular to the base substrate 101.

In the embodiments of the present disclosure, as illustrated in FIG. 13A to FIG. 14B, FIG. 17A to FIG. 17B and FIG. 20, the via hole is not provided in a portion of the first insulation layer 102, which overlaps with a plurality of first dummy electrodes de10 in the direction perpendicular to the base substrate 101.

In the embodiments of the present disclosure, as illustrated in FIG. 13A to FIG. 14B, FIG. 17A to FIG. 17B and FIG. 20, the via hole is not provided in a portion of the first insulation layer 102, which overlaps with a plurality of second dummy electrodes de20 in the direction perpendicular to the base substrate 101.

In the embodiments of the present disclosure, as illustrated in FIG. 8A to FIG. 8B, FIG. 13A to FIG. 14B, FIG. 17A to FIG. 17B and FIG. 20, the via hole V1 is disposed in a portion of the first insulation layer 102, which overlaps with a plurality of connecting electrodes 103a0 in the direction perpendicular to the base substrate 101.

In the embodiments of the present disclosure, as illustrated in FIG. 8A to FIG. 8B, FIG. 13A to FIG. 14B, FIG. 17A to FIG. 17B and FIG. 20, the via hole V2 is disposed in a portion of the first insulation layer 102, which overlaps with the plurality of first electrodes 1030 in the direction perpendicular to the base substrate 101.

In the embodiments of the present disclosure, as illustrated in FIG. 17A to FIG. 17B and FIG. 20, the via hole V3 is disposed in a portion of the first insulation layer 102, which overlaps with the plurality of sensor electrodes 1030 in the direction perpendicular to the base substrate 101.

In the embodiments of the present disclosure, as illustrated in FIG. 8A to FIG. 8B, FIG. 13A to FIG. 13B and FIG. 17A to FIG. 17B, the conductive filling portion 103d1 is floated, the first dummy electrode de10 is floated, and the second dummy electrode de20 is floated. For example, the words of "floated" refer to the case where the pixel driving signal is not received. In some embodiments, the floated structure does not directly receive the first power signal. In some embodiments, the floated structure can indirectly receive the first power signal.

In the embodiments of the present disclosure, the first electrode is configured to receive the pixel driving signal, the second electrode is configured to receive the first power signal, and the sensor electrode is configured to receive the detection driving signal. The pixel driving signal, for example, includes at least one selected from the group consisting of a second power signal VDD, a data signal, a gate signal, a light-emitting control signal EM, and a reset control signal RE.

In the embodiments of the present disclosure, the silicon wafer includes a silicon-based base and a circuit structure located on the silicon-based base, and the circuit structure includes a pixel circuit, a detecting circuit and the like.

Figure 23:
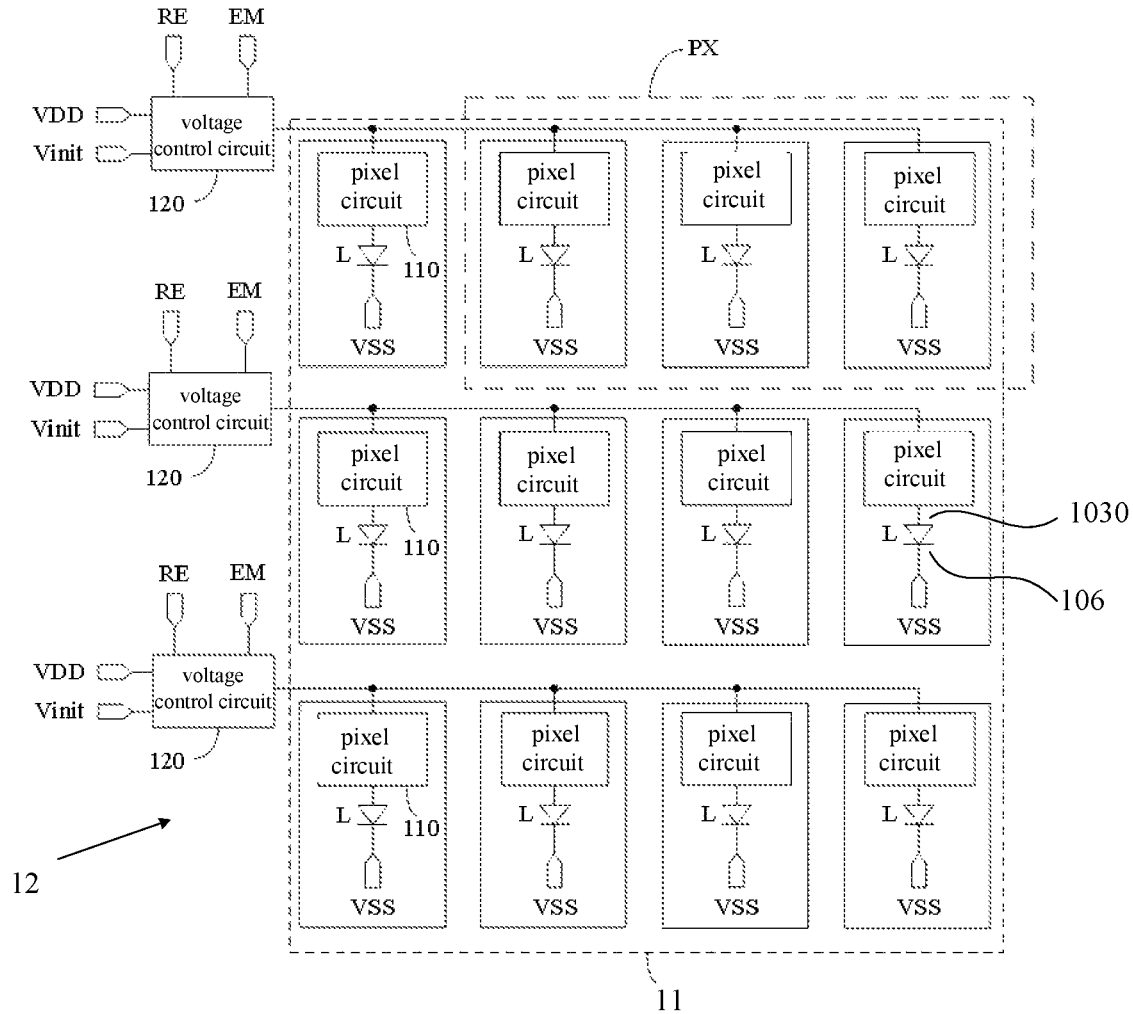
FIG. 23 is a schematic diagram of a circuit principle of a silicon-based organic light-emitting display panel provided by some embodiments of the present disclosure.

FIG. 23 is a schematic diagram of a circuit principle of a silicon-based organic light-emitting display panel provided by some embodiments of the present disclosure. The silicon-based organic light-emitting display panel includes a plurality of light-emitting elements L located in a display region 11 and a plurality of pixel circuits 110 coupled to the plurality of light-emitting elements L in a one-to-one correspondence; and the pixel circuit 110 includes a drive transistor. The pixel circuit 110 is configured to provide the pixel driving signal. Moreover, the silicon-based organic light-emitting display panel may further include a plurality of voltage control circuits 120 located in the peripheral region 12 of the silicon-based organic light-emitting display panel. For example, in one row, at least two pixel circuits 110 share one voltage control circuit 120, and in the pixel circuits 110 of one row, first electrodes of the drive transistors are coupled to the shared voltage control circuit 120, and a second electrode of each drive transistor is coupled to the corresponding light-emitting element L. The voltage control circuit 120 is configured to: in response to the reset control signal RE, output an initializing signal Vinit to the first electrode of the drive transistor, and control the corresponding light-emitting element L to be reset; and in response to the light-emitting control signal EM, output a second power signal VDD to the first electrode of the drive transistor so as to drive the light-emitting element L to emit light. By sharing the voltage control circuit 120, the structure of each pixel structure in the display region 101 can be simplified, and an occupied area of the pixel circuit in the display region 11 can be reduced, so that more pixel circuits and light-emitting elements can be arranged in the display region 11 and a high-PPI organic light-emitting display panel can be implemented. Moreover, the voltage control circuit 120, under the control of the reset control signal RE, outputs the initializing signal Vinit to the first electrode of the drive transistor, and controls the corresponding light-emitting element to be reset, so that influence of a voltage loaded onto the light-emitting element when a previous frame emits light on light emission of a next frame can be avoided, thereby improving an image sticking phenomenon. For example, the first electrode of the drive transistor is one of a source electrode or a drain electrode, and the second electrode of the drive transistor is the other one of the source electrode or the drain electrode. In the embodiments of the present disclosure, the light-emitting element may include an OLED, without limited thereto.

For example, the silicon-based organic light-emitting display panel may further include a plurality of pixel units PX located in the display region 11, and each pixel unit PX includes a plurality of sub pixels; and each sub pixel includes one light-emitting element L and one pixel circuit 110. Further, the pixel unit PX may include three sub pixels of different colors. The three sub pixels may be a red sub pixel, a green sub pixel and a blue sub pixel, respectively. Of course, the pixel unit PX may also include four, five or more sub pixels, it needs to be designed and determined according to an actual application environment, without limited herein.

For example, the pixel circuits 110 in at least two adjacent sub pixels in the same row may share one voltage control circuit 120. For example, as illustrated in FIG. 23, all the pixel circuits 110 in the same row can share one voltage control circuit 120. Or, the pixel circuits 110 in two, three or more adjacent sub pixels in the same row can share one voltage control circuit 120, and the present disclosure does not make any limit herein. Therefore, the occupied area of the pixel circuit in a display region A can be reduced by sharing the voltage control circuit 120.

As illustrated in FIG. 26, two electrodes of the light-emitting element L can be the first electrode 1030 and the second electrode 106, respectively. For example, the first electrode 1030 is an anode of the light-emitting element L, and the second electrode 106 is a cathode of the light-emitting element L. The first electrode 1030 is connected with the pixel circuit 110, and the first power signal VSS can be input into the second electrode 106. The first power signal VSS can be transmitted to the second electrode 106 by a connecting line and the connecting electrode 103a0.

In the embodiments of the present disclosure, an element A surrounds an element B, which may refer to the case where the element A is at least located at one side of the element B, and the element A may surround at least a part of the element B. The element B is not limited to a closed shape.

In the embodiments of the present disclosure, elements located in the same layer may be made of the same film layer by the same patterning process. For example, the elements located in the same layer may be located on a surface of the same element away from the base substrate.

It should be noted that, for the purpose of clarity only, in accompanying drawings for illustrating the embodiment(s) of the present disclosure, the thickness and size of a layer or a structure may be enlarged. However, it should be understood that, in the case where a component such as a layer, film, area, substrate or the like is referred to be "on" or "under" another component, it may be directly on or under the another component or a component is interposed therebetween.

In the embodiments of the present disclosure, patterning or a patterning process may include only a photolithography process, or include a photolithography process and an etching process, or may include other processes for forming a predetermined pattern, such as a printing process, an inkjet process, and the like. A photolithography process includes forming a pattern by processes such as film forming, exposure, and development etc., by using photoresist, mask, exposure machine etc. The corresponding patterning process may be selected according to the structure formed in the embodiments of the present disclosure.

In case of no conflict, features in one embodiment or in different embodiments can be combined.

The above are the embodiments of the present disclosure only without construing any limitation to the scope of the present disclosure; any of those skilled in related arts may easily conceive variations and substitutions in the technical scopes disclosed by the present disclosure, which should be encompassed in protection scopes of the present disclosure. Therefore, the scopes of the present disclosure should be defined in the appended claims.

What is claimed is:

1. A display substrate, comprising:
   a base substrate;
   a first insulation layer, located on the base substrate;
   a first electrode pattern, located in a display region of the display substrate, the first electrode pattern comprising a plurality of first electrodes spaced apart from each other, and each of the plurality of first electrodes being configured to receive a pixel driving signal;
   a connecting electrode pattern, located in a peripheral region of the display substrate, the connecting electrode pattern surrounding the first electrode pattern;
   a second electrode, located in the display region and the peripheral region and connected with the connecting electrode pattern, the second electrode and the first electrode pattern being spaced apart from each other, and the second electrode being configured to receive a first power signal;
   a light-emitting functional layer, located between the first electrode pattern and the second electrode; and
   a first filling layer, located between the connecting electrode pattern and the first electrode pattern,
   wherein the first filling layer and the light-emitting functional layer are different layers; and
   the first electrode pattern and the connecting electrode pattern are located at a side of the first insulation layer away from the base substrate, and are in contact with the first insulation layer, respectively; a portion of the first insulation layer that is located between the first electrode pattern and the connecting electrode pattern has a groove, and the first filling layer is at least partially located in the groove.

2. The display substrate according to claim 1, wherein the first electrode pattern comprises an edge first-electrode close to the connecting electrode pattern, and the insulation filling layer is in contact with the connecting electrode pattern and the edge first-electrode, respectively.

3. The display substrate according to claim 1, of wherein the connecting electrode pattern is of a ring shape.

4. The display substrate according to claim 1, wherein the second electrode is in contact with the first filling layer.

5. The display substrate according to claim 1, wherein the first filling layer comprises an insulation layer.

6. The display substrate according to claim 1, wherein the first filling layer comprises at least one conductive filling portion and at least one insulation filling portion, the edge first-electrode is in contact with the insulation filling portion, and the edge first-electrode and the conductive filling portion are spaced apart from each other.

7. The display substrate according to claim 6, wherein the first filling layer comprises a plurality of conductive filling portions and a plurality of insulation filling portions, and the plurality of conductive filling portions and the plurality of insulation filling portions are alternatively arranged.

8. The display substrate according to claim 7, wherein at least two selected from the group consisting of a pattern density of the plurality of conductive filling portions, a pattern density of the connecting electrode pattern, and a pattern density of the first electrode pattern are the same.

9. The display substrate according to claim 1, further comprising a pixel defining layer, wherein the pixel defining layer comprises a plurality of pixel defining portions, and each of the plurality of pixel defining portions is located between adjacent first electrodes.

10. The display substrate according to claim 1, wherein the first filling layer or at least one insulation filling portion in the first filling layer is located in the same layer as the pixel defining layer.

11. The display substrate according to claim 1, wherein the first electrode pattern and the connecting electrode pattern are located in the same layer.

12. The display substrate according to claim 1, further comprising a second filling layer, wherein the second filling layer comprises at least one second filling portion, the connecting electrode pattern comprises a plurality of connecting electrodes, and the second filling portion is located between adjacent connecting electrodes.

13. The display substrate according to claim 12, wherein the second filling layer comprises an insulation layer.

14. The display substrate according to claim 12, wherein the second filling layer and the first filling layer are located in the same layer.

15. The display substrate according to claim 1, wherein the light-emitting functional layer is in contact with the first filling layer.

16. The display substrate according to claim 15, wherein the light-emitting functional layer is in contact with a part of the first filling layer.

17. The display substrate according to claim 1, wherein the first electrode is an anode of a light-emitting element, and the second electrode is a cathode of the light-emitting element.

18. A display device, comprising the display substrate according to claim 1.

19. A manufacturing method of a display substrate, comprising:
   forming a first insulation layer on a base substrate;
   forming a first electrode pattern, the first electrode pattern being located in a display region of the display substrate, the first electrode pattern comprising a plurality of first electrodes spaced apart from each other, each of the plurality of first electrodes being configured to receive a pixel driving signal;
   forming a connecting electrode pattern, the connecting electrode pattern being located in a peripheral region of the display substrate, the connecting electrode pattern surrounding the first electrode pattern;
   forming a second electrode, the second electrode being located in the display region and the peripheral region, the second electrode being connected with the connecting electrode pattern, the second electrode and the first electrode pattern being spaced apart from each other, the second electrode being configured to receive a first power signal;
   forming a light-emitting functional layer, the light-emitting functional layer being located between the first electrode pattern and the second electrode; and
   forming a first filling layer, the first filling layer being located between the connecting electrode pattern and the first electrode pattern,
   wherein the first filling layer and the light-emitting functional layer are different layers, the first electrode pattern and the connecting electrode pattern are located at a side of the first insulation layer away from the base substrate, and are in contact with the first insulation layer, respectively, a portion of the first insulation layer that is located between the first electrode pattern and the connecting electrode pattern has a groove, and the first filling layer is at least partially located in the groove.

20. The manufacturing method of the display substrate according to claim 19, wherein the first electrode pattern comprises an edge first-electrode close to the connecting electrode pattern, and the insulation filling layer is in contact with the connecting electrode pattern and the edge first-electrode, respectively.

\* \* \* \* \*